US012755367B2

(12) United States Patent
Avrahami et al.

(10) Patent No.: US 12,755,367 B2
(45) Date of Patent: Oct. 6, 2026

(54) AUTOMATED INSPECTION

(71) Applicant: Kitov AI Ltd., Kfar Kasim (IL)

(72) Inventors: Nir Avrahami, Petach Tikva (IL); Joseph Rubner, Shoham (IL)

(73) Assignee: Kitov AI Ltd., Kfar Kasim (IL)

( * ) Notice: Subject to any disclaimer, the term of this patent is extended or adjusted under 35 U.S.C. 154(b) by 343 days.

(21) Appl. No.: 17/169,705

(22) Filed: Feb. 8, 2021

(65) Prior Publication Data

US 2021/0166364 A1 Jun. 3, 2021

Related U.S. Application Data

(63) Continuation of application No. 15/528,833, filed as application No. PCT/IB2015/002414 on Nov. 24, 2015, now Pat. No. 10,916,005.

(Continued)

(51) Int. Cl.
*G06T 7/00* (2017.01)
*G05B 19/418* (2006.01)

(Continued)

(52) U.S. Cl.
CPC ........ *G06T 7/001* (2013.01); *G05B 19/41875* (2013.01); *G06F 30/00* (2020.01); *G06T 7/0006* (2013.01); *G06T 7/70* (2017.01); *G05B 2219/35012* (2013.01); *G05B 2219/45066* (2013.01); *G06T 2200/24* (2013.01);

(Continued)

(58) Field of Classification Search
None
See application file for complete search history.

(56) References Cited

U.S. PATENT DOCUMENTS

| | | | |
|---|---|---|---|
| 4,511,925 | A | 4/1985 | Mackenroth, III |
| 5,815,198 | A | 9/1998 | Vachtsevanos et al. |

(Continued)

FOREIGN PATENT DOCUMENTS

| | | |
|---|---|---|
| CN | 1440543 | 9/2003 |
| CN | 101981683 | 2/2011 |

(Continued)

OTHER PUBLICATIONS

Notice of Reason(s) for Rejection Dated Nov. 6, 2022 From the Japan Patent Office Re. Application No. 2022-016562 and Its Machine Translation Into English. (7 Pages).

(Continued)

*Primary Examiner* — Sean M Conner

(57) ABSTRACT

Systems, methods, and related technologies for automated inspection are described. In certain aspects, one or more images of a reference part can be captured and the one or more images of the reference part can be processed to generate an inspection model of the reference part. One or more regions of the inspection model can be associated with one or more analysis parameters. An inspection plan can be generated based on the inspection model and the one or more analysis parameters. Based on the inspection plan, one or more images of a part to be inspected can be captured and the one or more images of the part can be processed in relation to the analysis parameters to compute one or more determinations with respect to the part. One or more outputs can be providing based on the one or more determinations.

31 Claims, 12 Drawing Sheets

Related U.S. Application Data

(60) Provisional application No. 62/083,807, filed on Nov. 24, 2014.

(51) Int. Cl.
*G06F 30/00* (2020.01)
*G06T 7/70* (2017.01)

(52) U.S. Cl.
CPC ..... *G06T 2207/30108* (2013.01); *Y02P 90/02* (2015.11); *Y02P 90/80* (2015.11)

(56) References Cited

U.S. PATENT DOCUMENTS

| | | | |
|---|---|---|---|
| 5,859,923 A | 1/1999 | Petry, III et al. | |
| 6,324,298 B1 | 11/2001 | O'Dell et al. | |
| 6,445,812 B1 | 9/2002 | Lai et al. | |
| 6,687,398 B1 * | 2/2004 | Kriwet | G06V 20/66 382/151 |
| 7,111,783 B2 | 9/2006 | Xi et al. | |
| 7,146,291 B2 | 12/2006 | Hough | |
| 7,167,583 B1 | 1/2007 | Lipson et al. | |
| 7,689,003 B2 | 3/2010 | Shannon et al. | |
| 8,059,151 B2 | 11/2011 | Ersue et al. | |
| 8,379,965 B2 | 2/2013 | Iwanaga | |
| 8,781,208 B2 | 7/2014 | Stalker et al. | |
| 10,417,757 B2 | 9/2019 | Kobayashi | |
| 2001/0011706 A1 * | 8/2001 | Nara | G03F 7/70616 250/397 |
| 2003/0208740 A1 | 11/2003 | Tourne et al. | |
| 2004/0087037 A1 | 5/2004 | Berg et al. | |
| 2004/0157134 A1 | 8/2004 | Kim et al. | |
| 2004/0223053 A1 | 11/2004 | Gladnick et al. | |
| 2006/0079989 A1 | 4/2006 | Ishii et al. | |
| 2007/0005178 A1 | 1/2007 | Prestidge et al. | |
| 2007/0237385 A1 * | 10/2007 | Kato | G01N 21/9501 382/149 |
| 2007/0288219 A1 * | 12/2007 | Zafar | G06T 7/0008 703/14 |
| 2008/0130982 A1 | 6/2008 | Kitamura et al. | |
| 2008/0281548 A1 | 11/2008 | Algranati et al. | |
| 2009/0304261 A1 * | 12/2009 | Takahashi | G01N 21/9501 340/653 |
| 2010/0061620 A1 * | 3/2010 | Doe | G06T 7/0004 382/145 |
| 2010/0283847 A1 * | 11/2010 | Aikawa | G21C 17/003 348/135 |
| 2011/0129141 A1 | 6/2011 | Hiroi et al. | |
| 2011/0288814 A1 | 11/2011 | Mizutani et al. | |
| 2011/0298901 A1 * | 12/2011 | Derrien | G05B 19/401 348/E13.074 |
| 2012/0057773 A1 | 3/2012 | Langmatz et al. | |
| 2012/0308112 A1 * | 12/2012 | Hu | G01N 23/225 382/149 |
| 2013/0236088 A1 * | 9/2013 | Umehara | G06T 7/001 382/149 |
| 2013/0301904 A1 | 11/2013 | Lee et al. | |
| 2014/0050389 A1 | 2/2014 | Mahadevan et al. | |
| 2014/0185912 A1 | 7/2014 | Lim et al. | |
| 2014/0254913 A1 | 9/2014 | Pang | |
| 2014/0336928 A1 | 11/2014 | Scott | |
| 2014/0341462 A1 | 11/2014 | Sezginer et al. | |
| 2015/0012171 A1 | 1/2015 | Richter et al. | |
| 2015/0139531 A1 | 5/2015 | Hirai et al. | |
| 2015/0214000 A1 * | 7/2015 | Hirai | G06T 7/001 382/141 |
| 2016/0125583 A1 | 5/2016 | Amanulllah et al. | |
| 2019/0213724 A1 | 7/2019 | Avrahami et al. | |

FOREIGN PATENT DOCUMENTS

| | | |
|---|---|---|
| CN | 102378909 | 3/2012 |
| JP | 62-261048 | 11/1987 |
| JP | 07-098217 | 4/1995 |
| JP | 07-107510 | 4/1995 |
| JP | 2001-004339 | 1/2001 |
| JP | 2001-520422 | 10/2001 |
| JP | 2004-502250 | 1/2004 |
| JP | 2004-093338 | 3/2004 |
| JP | 2006-208362 | 8/2006 |
| JP | 2010-519540 | 6/2010 |
| JP | 2011-174896 | 9/2011 |
| JP | 2012-515895 | 7/2012 |
| JP | 2013-140468 | 7/2013 |
| WO | WO 02/01504 | 1/2002 |
| WO | WO 02/088688 | 11/2002 |
| WO | WO 2010/112894 | 10/2010 |
| WO | WO2016/083897 | 6/2016 |

OTHER PUBLICATIONS

Translation Dated Oct. 21, 2021 of Notice of Reason for Rejection Dated Oct. 4, 2021 From the Japan Patent Office Re. Application No. 2017-546056. (3 Pages).

Advisory Action Before the Filing of an Appeal Brief Dated May 8, 2020 From the US Patent and Trademark Office Re. U.S. Appl. No. 15/528,833. (7 Pages).

Communication Pursuant to Article 94(3) EPC Dated Jul. 1, 2020 From the European Patent Office Re. Application No. 15863436.0. (7 Pages).

Communication Pursuant to Article 94(3) EPC Dated May 17, 2019 From the European Patent Office Re. Application No. 15863436.0. (6 Pages).

International Preliminary Report on Patentability Dated Jan. 24, 2017 From the International Preliminary Examining Authority Re. Application No. PCT/IB2015/002414. (4 Pages).

International Search Report and the Written Opinion Dated May 2, 2016 From the International Searching Authority Re. Application No. PCT/IL2015/002414. (14 Pages).

Notice of Allowance Dated Oct. 2, 2020 From the US Patent and Trademark Office Re. U.S. Appl. No. 15/528,833. (24 Pages).

Notice of Reason(s) for Rejection Dated Jan. 7, 2020 From the Japan Patent Office Re. Application No. 2017-546056. (5 Pages).

Notice of Reasons of Refusal Dated Jan. 5, 2021 From the Japan Patent Office Re. Application No. 2017-546056 and Its Machine Translation Into English. (16 Pages).

Notification of Office Action and Search Report Dated Mar. 26, 2020 From the State Intellectual Property Office of the People's Republic of China Re. Application No. 201580074364.7 and Its Translation of Office Action Into English. (5 Pages).

Official Action Dated Aug. 8, 2019 From the US Patent and Trademark Office Re. U.S. Appl. No. 15/528,833. (18 Pages).

Official Action Dated Feb. 19, 2020 From the US Patent and Trademark Office Re. U.S. Appl. No. 15/528,833. (18 Pages).

Supplementary European Search Report and the European Search Opinion Dated Jun. 15, 2018 From the European Patent Office Re. Application No. 15863436.0. (9 Pages).

Brosed et al. "3D Geometrical Inspection of Complex Geometry Parts Using a Novel Laser Triangulation Sensor and a Robot", Sensors 11(1), 90-110, Dec. 23, 2010.

Notice of Reason(s) for Rejection Dated Oct. 4, 2021 From the Japan Patent Office Re. Application No. 2017-546056 and Its Translation Into English.

Communication Pursuant to Article 94(3) EPC Dated Jun. 17, 2021 From the European Patent Office Re. Application No. 15863436.0. (6 Pages).

Translation Dated Nov. 9, 2022 of Notice of Reason for Rejection Dated Nov. 6, 2022 From the Japan Patent Office Re. Application No. 2022-016562. (3 Pages).

Notice of Reason(s) for Rejection Dated Jul. 26, 2023 From the Japan Patent Office Re. Application No. 2022-016562 and Its Machine Translation Into English. (11 Pages).

Translation Dated Aug. 24, 2023 of Notice of Reason(s) for Rejection Dated Jul. 26, 2023 From the Japan Patent Office Re. Application No. 2022-016562. (4 pages).

(56) References Cited

OTHER PUBLICATIONS

Notice of Reason(s) for Rejection Dated Apr. 10, 2024 From the Japan Patent Office Re. Application No. 2022-016562 and Its Machine Translation Into English. (7 Pages).
Notification of Office Action and Search Report Dated Jun. 21, 2024 From the National Intellectual Property Administration of the People's Republic of China Re. Application No. 202110016463.7. (15 Pages).
Translation Dated May 10, 2024 of Notice of Reason(s) for Rejection Dated Apr. 10, 2024 From the Japan Patent Office Re. Application No. 2022-01656. (3 Pages).

* cited by examiner

AUTOMATED INSPECTION

RELATED APPLICATIONS

This application is a continuation of U.S. patent application Ser. No. 15/528,833 filed on May 23, 2017, which is a National Phase of PCT Patent Application No. PCT/IB2015/002414 having International Filing Date of Nov. 24, 2015, which claims the benefit of U.S. patent application Ser. No. 62/083,807 filed on Nov. 24, 2014 . The contents of the above applications are all incorporated by reference as if fully set forth herein in their entirety.

FIELD AND BACKGROUND OF THE INVENTION

Aspects and implementations of the present disclosure relate to data processing, and more specifically, to automated inspection.

In many industries, such as those involving manufactured products, it can be advantageous to inspect such products to ensure they are free of defects. Such inspections are frequently conducted manually (e.g., by human inspectors) which can result in various inaccuracies and inefficiencies.

SUMMARY OF THE INVENTION

The following presents a simplified summary of various aspects of this disclosure in order to provide a basic understanding of such aspects. This summary is not an extensive overview of all contemplated aspects, and is intended to neither identify key or critical elements nor delineate the scope of such aspects. Its purpose is to present some concepts of this disclosure in a simplified form as a prelude to the more detailed description that is presented later.

In one aspect of the present disclosure, one or more images of a reference part can be captured and the one or more images of the reference part can be processed (e.g., by a processing device) to generate an inspection model of the reference part. One or more regions of the inspection model can be associated with one or more analysis parameters. An inspection plan can be generated based on the inspection model and the one or more analysis parameters. Based on the inspection plan, one or more images of a part to be inspected can be captured and the one or more images of the part can be processed in relation to the analysis parameters to compute one or more determinations with respect to the part. One or more outputs can be providing based on the one or more determinations.

In another aspect of the present disclosure, one or more images of a reference part can be captured and the one or more images of the reference part can be processed to identify one or more aspects of the reference part. Based on the one or more aspects of the reference part, one or more inspection parameters can be identified. An inspection plan can be generated based on the one or more inspection parameters. Based on the inspection plan, one or more images of a part to be inspected can be captured and the one or more images of the part can be processed in relation to the one or more inspection parameters to compute one or more determinations with respect to the part. One or more outputs can be provided based on the one or more determinations.

BRIEF DESCRIPTION OF THE SEVERAL VIEWS OF THE DRAWING(S)

Aspects and implementations of the present disclosure will be understood more fully from the detailed description given below and from the accompanying drawings of various aspects and implementations of the disclosure, which, however, should not be taken to limit the disclosure to the specific aspects or implementations, but are for explanation and understanding only.

DESCRIPTION OF SPECIFIC EMBODIMENTS OF THE INVENTION

Figure 1:
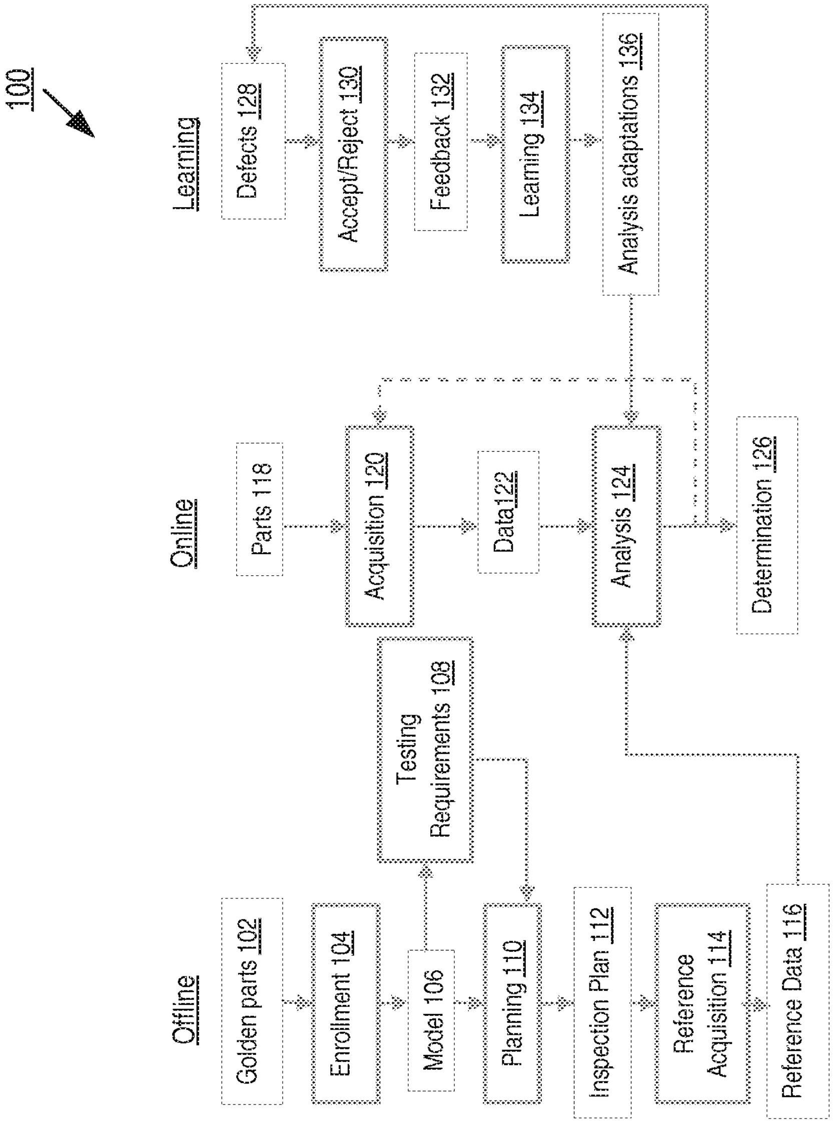
FIG. 1 depicts a flow diagram of aspects of a method for automated inspection in accordance with one implementation of the present disclosure.

Aspects and implementations of the present disclosure are directed to automated inspection and measurement. The systems and methods disclosed can be employed with respect to manufactured or assembled products and objects, manufacturing processes, etc. More particularly, it can be appreciated that automated inspection (e.g., automated visual inspection) is a highly challenging task. Numerous steps, procedures, and operations are often involved in order to properly define a specific inspection task in order to configure an inspection system to perform the inspection. Often, various aspects of this process are achieved via trial and error, resulting in considerable inefficiencies with respect to time and cost. As a result, in many scenarios the referenced inspection is performed manually (e.g., by human inspectors). This is particularly true in cases in which a manufacturing/production line is to be set for a relatively short time or small volume and thus it is unlikely to be cost effective to design and configure an inspection system for such a product. In addition to the time/cost inefficiencies associated with manual inspections, the results of such manual inspections are often imprecise and may not correspond to actual, objective measurements (metrology) (e.g., it may be difficult or time consuming for a human inspector to conclusively determine whether a scratch is deeper or longer than a defined threshold). In addition, manual inspection is often inconsistent between different humans and even for the same person due to fatigue, environmental conditions, etc.

Moreover, though certain technologies do attempt to automate certain aspects of visual inspection, numerous inefficiencies remain. For example, existing technologies are often complex and require highly trained/skilled users in order to configure such systems properly. As such, it may not be cost effective to utilize such systems (which, due to their complexity, can only be effectively configured by skilled/trained personnel) for the inspection of low-cost and/or low-margin parts. Additionally, existing technologies that attempt to automate certain aspects of visual inspection often require specialized/dedicated hardware/systems for the inspection of a particular part. Accordingly, such technologies (which have been designed/customized for the inspection of one part) cannot be (or cannot efficiently be) re-configured for the inspection of a different part. For this reason as well, such technologies are ill-suited for the inspection of parts which may be manufactured or otherwise produced in relatively low quantities (as such quantities may not justify the investment in dedicated inspection hardware/configuration(s)). Moreover, various existing inspection technologies are designed/configured to capture multiple images (e.g., parallel images using different image capture settings, illumination, etc.) and subsequently utilizing only a small number of such images for the purposes of inspection. Such approaches result in considerable inefficiencies, e.g., with respect to the capture and processing of many images (e.g., using sub-optimal settings) which are not ultimately considered or accounted for in the particular inspection.

Accordingly, described herein in various implementations are systems, methods, techniques, and related technologies directed to automated inspection (e.g., part/product inspection). Among the referenced technologies is an inspection station or system configured for the inspection (e.g., surface inspection) of parts, objects, products, etc., such as those with complex three-dimensional structures. As described and/or depicted herein, in certain implementations the referenced inspection station/system can incorporate various hardware elements including but not limited to: illumination device(s), sensor(s), articulating arm(s) and/or any other such mechanical or robotic element(s). By incorporating such technologies, a single universal inspection system can be employed in practically any context/setting (e.g., for the inspection of practically any/all types of parts). Additionally, in certain implementations the described technologies can be configured in a relatively intuitive and straightforward manner, such that a user is not likely to need substantial or specialized training in order to configure the technologies to inspect a particular part in an efficient and effective manner. As described in detail herein, this can be achieved by leveraging previously stored/provided inspection parameters (e.g., inspection parameters computed and/or provided with respect to comparable or related features as found in other parts, such as the same or similar shape, the same or similar material, etc.) which can dictate preferred or optimal inspection parameters or settings that can be applied to certain areas, regions, aspects, elements, etc., of a part (examples of such parameters/settings include but are not limited to the angle(s), magnification level, illumination level(s), etc., at which the area, region, etc. should be scanned and/or how the corresponding sensor inputs should be processed/analyzed). In doing so, in lieu of a 'trial and error' approach (which can entail the capture and processing of a considerable number of images that are sub-optimal and not ultimately accounted for in the inspection), the described technologies can enable the capture and processing of a part to be inspected using optimal inspection settings/parameters (even at the first instance of inspection). Moreover, the described technologies can further enable the implementation of a highly efficient inspection process which can be configured, calibrated, etc. with respect to practically any part in a relatively short time. In doing so, a single inspection system/station can be utilized to inspect multiple parts/products. Additionally, such a system can transition from inspecting one product to inspecting another product with little or no 'downtime' in between inspections. In doing so, the described technologies (including the described inspection system) can be effectively and efficiently implemented in scenarios and settings (e.g., with respect to parts, products, etc.) with respect to which automated inspection might otherwise be inefficient or cost prohibitive.

Accordingly, it can be appreciated that the described technologies are directed to and address specific technical challenges and longstanding deficiencies in multiple technical areas, including but not limited to manufacturing, product inspection, and automation. It can be further appreciated that the described technologies provide specific, technical solutions to the referenced technical challenges and unmet needs in the referenced technical fields. It should also be understood that the referenced inspection system can be configured such that other inspection modules (e.g., those that pertain to labels, connectors, screws, etc.) can be easily combined/incorporated, as described herein.

In one implementation, an inspection device such as an optical head can include or otherwise incorporate a combination of camera(s), illumination devices (e.g., incandescent, infrared, laser, etc.) and/or one or more other sensors (e.g. 3D sensors) that can be maneuvered in space relative to the object/part under inspection (it should be understood that, in certain implementations the inspected part can be moved in addition to or instead of the optical head). As described herein, the optical head can be configured in a particular manner in order to provide the requested/required sensory data with respect to the inspected object/part (for example, use different illumination fields/directions/color/intensity that may be chosen/selected/activated in the optical head for different images taken). By way of illustration, FIG. 7A (in addition to various other figures) depicts an exemplary optical head 710, which can include one or more of the referenced sensors, components, devices, elements, etc.

It should also be understood that the referenced optical head can be maneuvered in any number of ways, such as is described herein. In one implementation the optical head can be mounted on a moveable arm/robot, while the optical head configurations can be defined/determined based on an analysis of images captured by the cameras of the optical head at different angles and/or with different levels/types/directions of illumination. By way of illustration, FIG. 7A (in addition to various other figures) depicts aspects of an exemplary inspection system 700 which can include moveable arm/robot 720, to which optical head 710 can be mounted, as shown (it should be understood that inspection system 700 can also include additional components that are not shown, including but not limited to components, devices, etc. depicted in FIGS. 11-12 and described in detail herein). In other implementations, one or more static cameras/illumination devices (not shown) may be implemented in addition to/instead of the maneuverable optical head (for example, multiple cameras and/or illumination devices can be arranged, e.g., in fixed positions, surrounding the part to be inspected). In yet other implementations, multiple optical heads (e.g., on moveable arms) may be implemented. In yet other implementations, one or more line scan or three-dimensional (3D) cameras can be implemented.

In certain implementations an additional/discrete computing device (e.g., one or more processors, such as those depicted in FIGS. 11 and 12 and described herein) can be installed or otherwise integrated at/within the optical head. Such a computing device can be configured, in certain implementations, to analyze raw data (e.g., the various data collected, captured, and/or computed by the optical head, such as is described herein). This preliminary analysis can enable significant efficiencies by reducing the amount of data (e.g., images, etc.) to be transmitted (e.g., to another system, device, etc., for additional processing), such as by identifying/sending only the parts/regions where a defect is suspected (or which otherwise require more complex processing) for a more complex analysis, such as on a dedicated station/computing-server. This enables and improves the scalability and efficiency of the described technologies. By way of further example, as described in detail herein, certain areas or regions of a part may be associated with specific inspection parameters, such as areas that are more susceptible to defects, that contain components or elements (e.g., screws, connectors, etc.) which may be subject to additional and/or different inspection parameters, and/or which must be defect-free if the part is to be accepted. Accordingly, in certain implementations, the referenced initial processing can be performed with respect to such areas/regions. Upon determining that such areas/regions are acceptable (e.g., are free from defects), subsequent inspection processing (e.g., of other areas/regions of the part) can then be performed, as described herein.

In certain implementations, the referenced pre-computing can be performed in two phases. First, a processing device such as a single instruction, multiple data (SIMD) processor (e.g., a GPU) can operate locally, e.g., on particular neighborhoods/regions of an image. Then, another processing device (e.g., a CPU) can combine the information of multiple regions to compute a broader (e.g., image-wide) decision/determination, for example, with respect to a long scratch that covers several neighborhoods/regions of the part, object, product, etc. under inspection.

It should be understood that various aspects of the described techniques and technologies may be enhanced or improved based on aspects and/or configurations of the referenced inspection system (for example, aspects of such system which may be flexible and/or easily and efficiently configurable/re-configurable). As previously noted, in certain implementations an inspection station/system can incorporate various hardware elements including but not limited to: illumination device(s), sensor(s), articulating arm(s) and/or any other such mechanical or robotic element(s). Each of the referenced elements can be utilized and/or activated using any number of parameters, settings, etc. In doing so, a single universal inspection system/station can be easily and efficiently adapted for use in practically any context/setting (e.g., for the inspection of practically any/all types of parts/products). Additionally, such a system can transition from inspecting one part/product to inspecting another part/product (whether a similar/related part/product or an entirely different/unrelated part/product) with little or no 'downtime' between inspections. There may be any number of possible configurations for the referenced system.

Figure 7B:
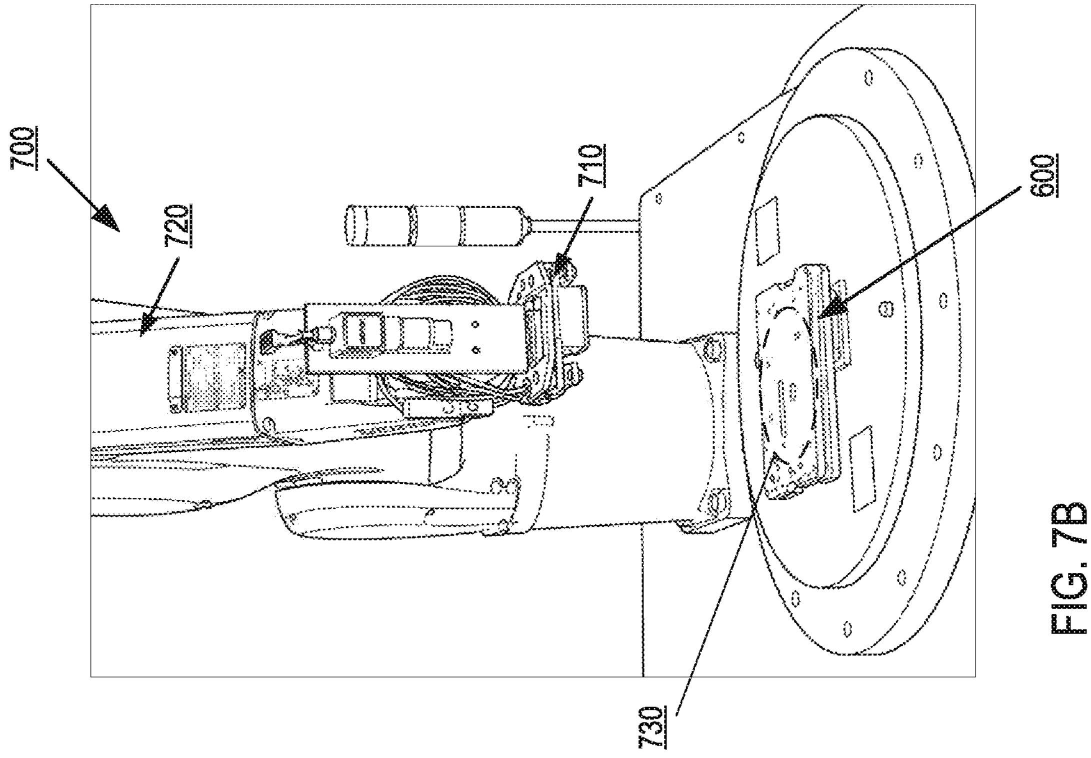
FIG. 7A-7B depict one or more aspects of an exemplary inspection system in accordance with one implementation of the present disclosure.
Figure 7A:
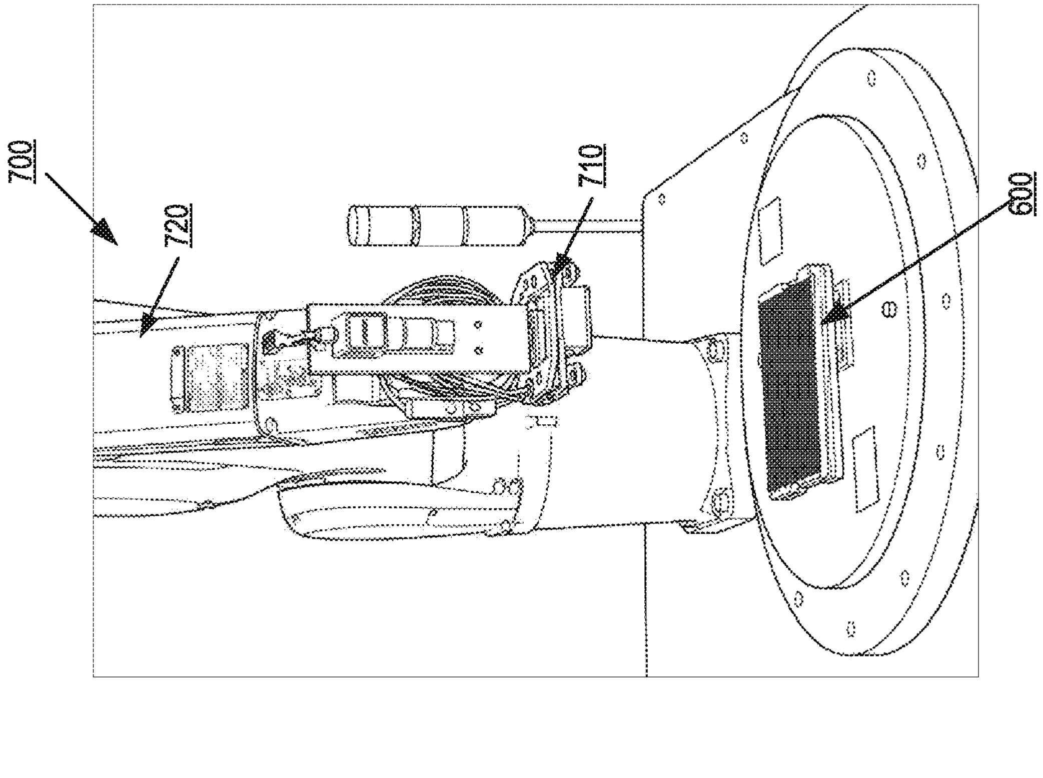

As noted, in certain implementations the optical head (or heads) may include or otherwise incorporate one or more sensors (e.g. 1D/2D/3D cameras, etc.), which can operate in conjunction with one or more illumination sources (which may be of different relative position, spectrum, type, etc.). Moreover, the optical head can be positioned/oriented in any number of ways. In certain implementations the optical head may be oriented in a fixed position, while in other implementations the optical head may be mounted on a robot or on several robotic arms (e.g., as depicted in FIGS. 7A and 7B). For example a camera can be mounted on one robotic arm while an illumination device may be installed on a second arm. In yet other implementations, the inspection system can incorporate multiple cameras/sensors/illumination devices, etc. operating jointly and/or independently in any number of configurations. It should be understood that the referenced elements may be fixed in position or be maneuverable according to the instructions/requirements of a particular inspection process.

In certain implementations the quality/appropriateness of an optical head configuration (such as for a particular inspection plan) can be determined or otherwise evaluated. For example, a knowledge-base (e.g., a "Best-Practices" knowledge-base) can be generated, provided, and/or received. Such a knowledge-base (which can be a database or any other such data repository) can include various cases/scenarios and/or rules for various configurations (e.g., good, acceptable, etc.) of a given optical head, e.g. for different materials, shapes, elements, etc. to be inspected. An example rule for a specific optical head with a single camera and a single illumination unit might apply to matte surfaces of homogenous color and would provide for various possible collections of parameters (camera-angle, illumination strength, exposure time, focus, working distance, required resolution, etc.) a quality score, e.g., in the range [0,1], where, for example, scores less than 0.5 are considered as unacceptable and a score of 1 is considered optimal. As described in detail herein, such a quality score can be accounted for in generating/computing an inspection plan with respect to a particular part (e.g., by generating an inspection plan that incorporates parameters determined to result in better or optimal results, while avoiding parameters determined to result in sub-optimal results).

By way of illustration, it can be appreciated that it may be advantageous to subject different areas, regions, aspects, elements, etc. of a part (e.g., a part to be inspected) to qualitatively and quantitatively different types of inspection. That is, as described in detail herein, it may be advantageous to subject one (or more) areas, regions, aspects, elements, etc. of a part to one type of inspection (at a particular level of inspection) while subjecting other areas, regions, aspects, elements, etc. of the same part to different types of (and/or levels of) inspection. It can be appreciated that the particular type of inspection that a particular area, region, aspect, element, etc. is associated with can be a function of any number of factors, including but not limited to size, shape, structure, material composition, etc. For example, with respect to a part that incorporates a glossy surface and one or more screws, it may be advantageous to inspect the glossy surface using one set of inspection techniques (e.g., using various degrees of illumination, etc., in order to determine if scratches are present) while inspecting the screw(s) using a different set of inspection techniques (e.g., inspecting such area(s) from different angles in order to determine whether the screw is present and/or if it is screwed in completely or only partially). As noted above, in certain implementations the particular parameters/inspection techniques to be applied to a particular area, region, etc., can be received from/determined based on a knowledge base which can reflect various quality scores for different sets of parameters as applied to a particular inspection context. Accordingly, those parameters/techniques that can be determined to provide high quality/optimal results for a specific inspection context/scenario (e.g., the inspection of a screw, a connector, a reflective surface, a certain material type, etc.) can be selected and incorporated into an inspection plan for the referenced part to be inspected, while those inspection parameters/techniques determined to provide sub-optimal results (e.g., as reflected in the referenced 'knowledge base') may not be incorporated into the inspection plan.

It should be understood that, in certain implementations such areas, regions, aspects, elements, etc. of a part may be identified or selected manually. For example, as described herein, a user/administrator can be presented with a model and/or any other such representation of a reference part, and such a user can select or identify (e.g., using a graphical user interface) respective areas, regions, aspects, elements, etc. of the part (e.g., the presence of a screw in one area, a glossy surface in another area, a connector in another area, etc.). In certain implementations, upon identifying/selecting such areas, regions, aspects, elements, etc., the user can further dictate or define various aspects of the inspection parameters that are to be applied to the particular region (e.g., to utilize various levels of illumination, to inspect from multiple angles, to determine the presence of scratches, etc.).

In other implementations, the referenced knowledge-base can be utilized to dictate the parameters to be applied to a particular region. For example, upon selecting a particular area or region of a part as containing a screw, the knowledge base can be queried to identify/determine inspection parameters to be applied to such a region (e.g., inspection parameters that are likely to enable the determination that such a screw is present and/or fully tightened, such as by capturing images of the region at different angles under different degrees of illumination). In doing so, the described technologies can enable an inspection system to quickly enroll new parts to be inspected, and to generate inspection plan(s) for such parts that enable the efficient and effective inspection of the parts (e.g., by inspecting respective areas, regions, aspects, elements, etc. of a part using different inspection parameters that reflect the specifications of that particular part). Additionally, in doing so the described technologies can enable a user who may not possess much (if any) experience or training in preparing inspection plans to accurately and efficiently define an inspection plan for a part that can be executed in an efficient and effective manner. As described, the user can simply select or otherwise indicate various areas, regions, aspects, elements, etc. of the part, and the described technologies can determine the inspection parameters to be associated with each respective area, etc. (e.g., utilizing the referenced knowledge base).

In yet other implementations, the referenced areas, regions, aspects, elements, etc. of a part may be identified or selected in an automatic or automated fashion. For example, as described herein, one or more reference part(s) and/or other types or forms of representation of the part (e.g., CAD models, etc.) can be received and/or provided. Such referenced part(s) can be analyzed or otherwise processed (e.g., based on inputs received from various types of sensors) in order to identify/determine the presence of respective areas, regions, aspects, elements, etc. within the reference part (e.g., the presence of a screw in one area, a glossy surface in another area, a connector in another area, etc.) (alternatively and/or additionally, the referenced representation of the part, e.g., a CAD model, can be processed in order to identify/determine respective areas, regions, aspects, elements, etc. within the model). In certain implementations, the referenced knowledge-base can then be utilized to determine the inspection parameters to be applied to each identified area, region, aspect, element, etc. For example, upon determining that a particular area or region of a part contains a screw, such a region can be associated with a particular set of inspection parameters (e.g., parameters that are likely to enable the determination that such a screw is present and/or fully tightened, such as by capturing images of the region at different angles under different degrees of illumination). In other implementations, upon identifying such areas, regions, aspects, elements, etc., a user may be enabled to manually dictate or define various aspects of the inspection parameters that are to be applied to the particular region, as described herein. In doing so, the described technologies can enable an inspection system to enroll new parts to be inspected, and to generate efficient and effective inspection plan(s) for such parts in an automated fashion.

Figure 5:
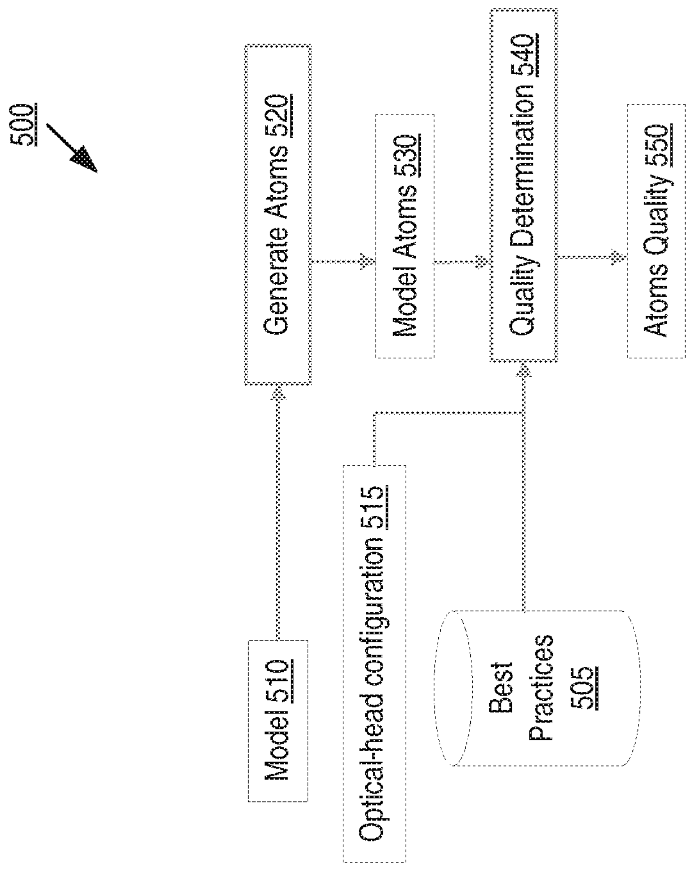
FIG. 5 depicts a flow diagram of aspects of a method for automated inspection in accordance with one implementation of the present disclosure.

FIG. 5 depicts a flow diagram of aspects of a method 500 for automated inspection. The method is performed by processing logic that may comprise hardware (circuitry, dedicated logic, etc.), software (such as is run on a computing device such as those described herein), or a combination of both. In one implementation, the method is performed by one or more elements depicted and/or described in relation to FIGS. 6-7B and 10A-12 (e.g., by one or more processors, by an inspection system, etc.), while in some other implementations, one or more blocks of FIG. 5 may be performed by another machine or machines.

For simplicity of explanation, methods are depicted and described as a series of acts. However, acts in accordance with this disclosure can occur in various orders and/or concurrently, and with other acts not presented and described herein. Furthermore, not all illustrated acts may be required to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring such methods to computing devices. The term article of manufacture, as used herein, is intended to encompass a computer program accessible from any computer-readable device or storage media.

As depicted in FIG. 5, when inspecting/processing a part/object, a multidimensional model of the part can be generated/obtained (510) (such as in a manner described herein). It should be understood that the referenced multidimensional model can include and/or otherwise incorporate any number of aspects, elements, etc. of the part. For example, the referenced multidimensional model can incorporate aspects of the part (and/or areas, regions, etc., thereof) including but not limited to: size, shape, structure (two-dimensional, three-dimensional, etc.), material composition, etc. Such a model can then be processed to logically divide the part into atomic parts ("Atoms") (e.g. infinitesimal surfaces, screws, connectors, etc.) (520). Each of the generated atoms can be considered and modeled individually (530), e.g., using the referenced knowledge base (505) and/or various aspects of the optical head configuration (515) in order to compute the referenced quality determination (540). Multiple atom quality evaluations can then be combined/unified to generate a complete quality score/determination (e.g., of the optical head with respect to the given inspected part) (550).

Figure 6:
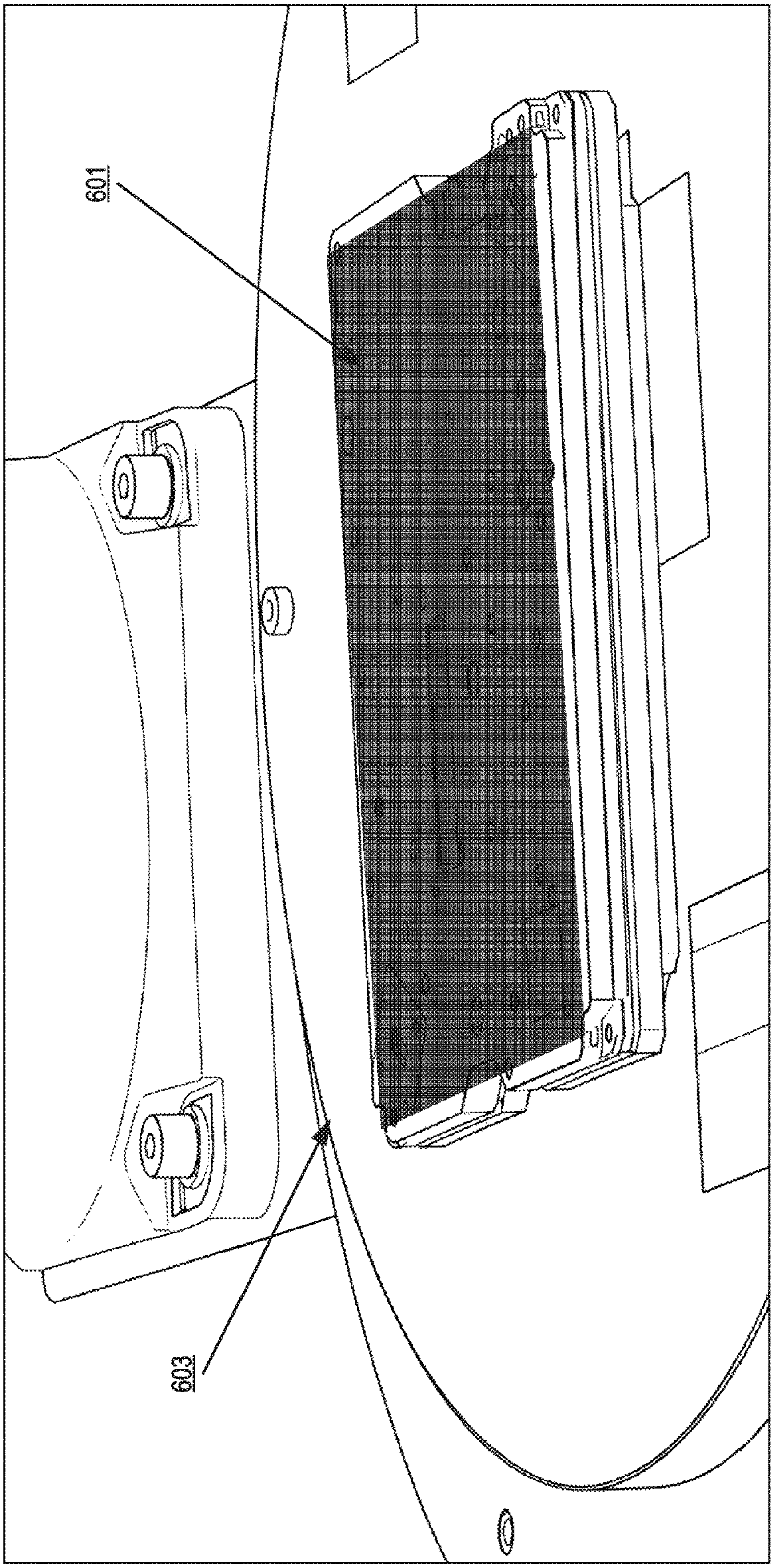
FIG. 6 depicts one or more aspects of an exemplary inspection system in accordance with one implementation of the present disclosure.

As noted, the object(s)/part(s) being inspected by the referenced inspection system may be positioned in any number of ways. For example, in certain implementations the part may be fixed (that is, it is inspected without otherwise changing or altering its position). In other implementations, the orientation of the part can be changed/adjusted, such as by utilizing a moving, rotating, etc. platform and/or a robotic arm to grip the part and to change its orientation (e.g., by rotating it) in relation to the optical head or optical capture device (e.g., in the case of a camera in a fixed position). In yet other implementations, the part may be positioned on a moving conveyer belt (and the inspection system may, for example, inspect the part, or various aspects thereof, while it remains in motion). By way of illustration, FIG. 6 depicts an exemplary part 601 situated on a platform 603. In certain implementations, platform 603 can be configured to rotate in any number of directions, angles, etc., such as in order to change the positioning of part 601, such as while the part is undergoing inspection, as described herein.

Described herein are various aspects of a method for automated inspection, such as is depicted in FIG. 1. The method (100) is performed by processing logic that may comprise hardware (circuitry, dedicated logic, etc.), software (such as is run on a computing device such as those described herein), or a combination of both. In one implementation, the method is performed by one or more components depicted and/or described in relation to FIGS. 6-7B and 10A-12 (e.g., by one or more processors, by an inspection system, etc.), while in some other implementations, one or more blocks of FIG. 5 may be performed by another machine or machines.

For simplicity of explanation, methods are depicted and described as a series of acts. However, acts in accordance with this disclosure can occur in various orders and/or concurrently, and with other acts not presented and described herein. Furthermore, not all illustrated acts may be required to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring such methods to computing devices. The term article of manufacture, as used herein, is intended to encompass a computer program accessible from any computer-readable device or storage media.

In certain implementations, an 'offline' process can be performed initially, and an 'online process' can subsequently be performed, such as for each object/part instance. In the referenced 'offline' process, one or more representative reference parts/objects (e.g., flawless 'golden' parts) can be provided (102) (e.g., to an inspection system 700 as depicted, for example, in FIG. 7A and described herein) and can be enrolled by the referenced inspection system (104). For example, upon introducing/providing the reference part/object to the inspection system, the system can scan or otherwise analyze the part in any number of ways (such as in a manner described herein) and a model (e.g., a multidimensional model) and/or any other such representation of part can be generated (106). Such a model can contain, for example, a rough and/or fine description/characterization/definition of various aspects of the geometry of the part and/or its visual characteristics (e.g., with respect to color, reflectance, etc.). Additionally, as described herein, in certain implementations the referenced model can contain certain regions that may be defined and/or characterized based on certain parameters (e.g., one level of specificity or precision) while other regions of the model are defined and/or characterized based other parameters (e.g., another level of specificity or precision).

Figure 2:
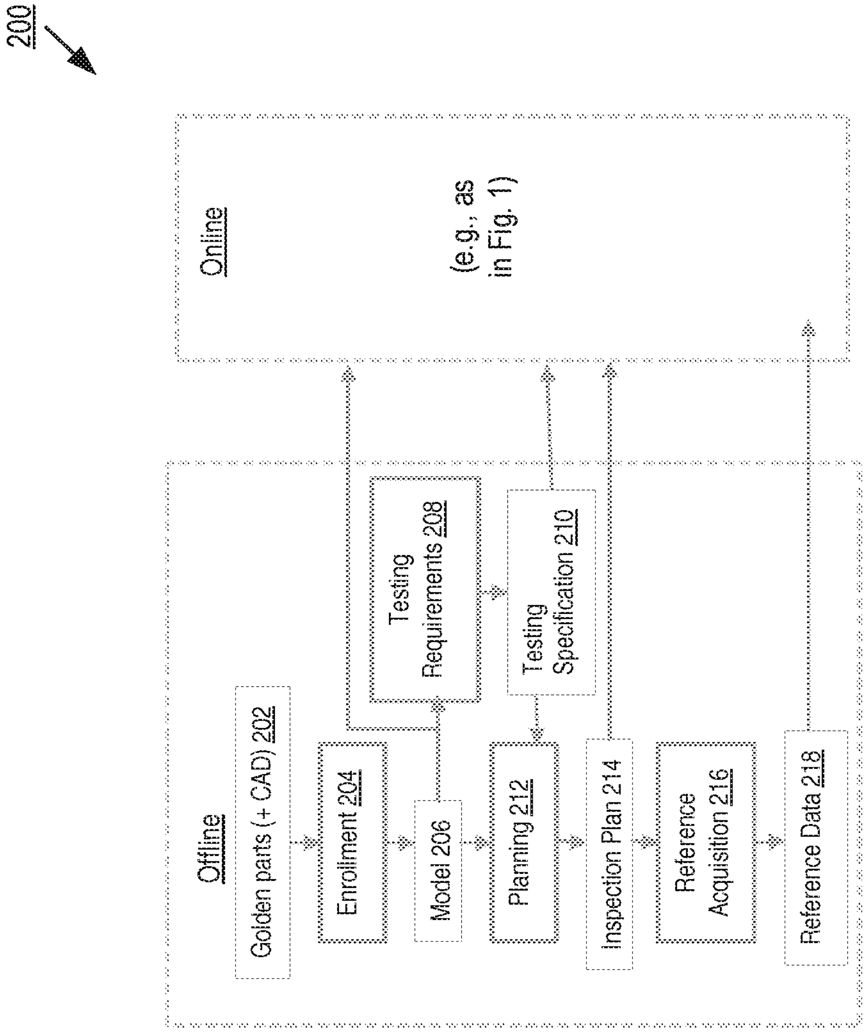
FIG. 2 depicts a flow diagram of aspects of a method for automated inspection in accordance with one implementation of the present disclosure.
Figure 3:
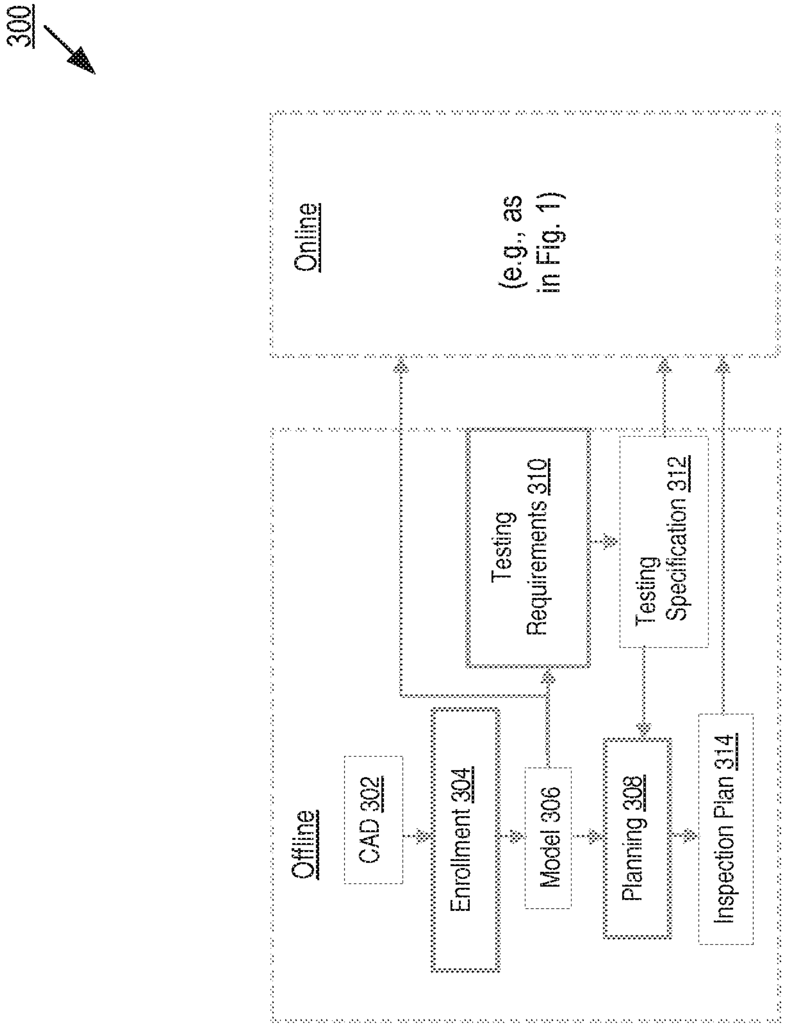
FIG. 3 depicts a flow diagram of aspects of a method for automated inspection in accordance with one implementation of the present disclosure.

FIG. 2 depicts further aspects of aspects of a method (200) for automated inspection. As shown in FIG. 2, a representative flawless golden part can be provided/introduced to the inspection system (202). In certain implementations, a corresponding model (e.g., a CAD model) may also be provided in addition to or instead of the golden part. The system can then begin scanning, exploring, or otherwise analyzing the structure of the part, such as by incremental data acquisition and analysis (e.g. using images, 3D local reconstruction, etc.). For example, FIG. 3 (showing further aspects of aspects of a method 300 for automated inspection) depicts a scenario in which a CAD model is initially received/provided (302) (e.g., in lieu of a reference part), and an enrollment process (such as is described herein) (304) can generate a model such as a degenerate multidimensional ('n-dimensional') model (306), such as in the manner described herein. In scenarios in which a reference model (e.g., a CAD model of the part) is provided/received, the referenced exploration (e.g., the initial analysis of the part/object) may follow the structure reflected in the model. During the exploration phase the configuration/settings of the optical head (e.g., with respect to its positioning) can be varied/adjusted, such as in order to provide comprehensive structural information based upon which an inspection model (e.g., a model generated for the purposes of subsequent inspections) can be generated. It should be noted that while various examples and illustrations provided herein pertain to visual inspection, the described technologies are not so limited. Accordingly, it should be appreciated that the described techniques can be applied in non-visual contexts as well (e.g., using metrology, etc.).

In certain implementations the part/object can be analyzed in order to ensure that accurate measurements are achieved for various aspects of the object, and also to define the structural boundaries of the object (e.g., in order to avoid damage to the inspection system or the part, such as in the case of a collision between a maneuverable optical head and the part). In certain implementations images may be captured from different directions relative to any number of points on the product, such as with different types/levels of illumination and/or from different directions. By way of illustration, FIG. 7A depicts optical head 710 capturing image(s) of object/part 601 under one level of illumination (e.g., without additional/supplemental illumination) while FIG. 7B depicts optical head 710 capturing image(s) of object/part 601 under one another of illumination (e.g., with additional/supplemental illumination 730).

Moreover, in scenarios in which both a CAD model and golden parts are utilized, variations/discrepancies between the original design of the part (such as is reflected in the CAD model) and the actual part(s) (e.g., the golden parts) can be identified/determined and a notification of such variations/discrepancies can be generated/provided (e.g., to an administrator). Additionally, in certain implementations such discrepancies/variations can be accounted for when inspecting subsequent parts. For example, having identified a discrepancy or variation between a CAD model and a 'golden' reference part, upon inspecting a subsequent part that reflects a comparable discrepancies/variations, such a part may not be identified as defective (based on the discrepancy identified between the CAD model and the reference part(s)).

Figure 4:
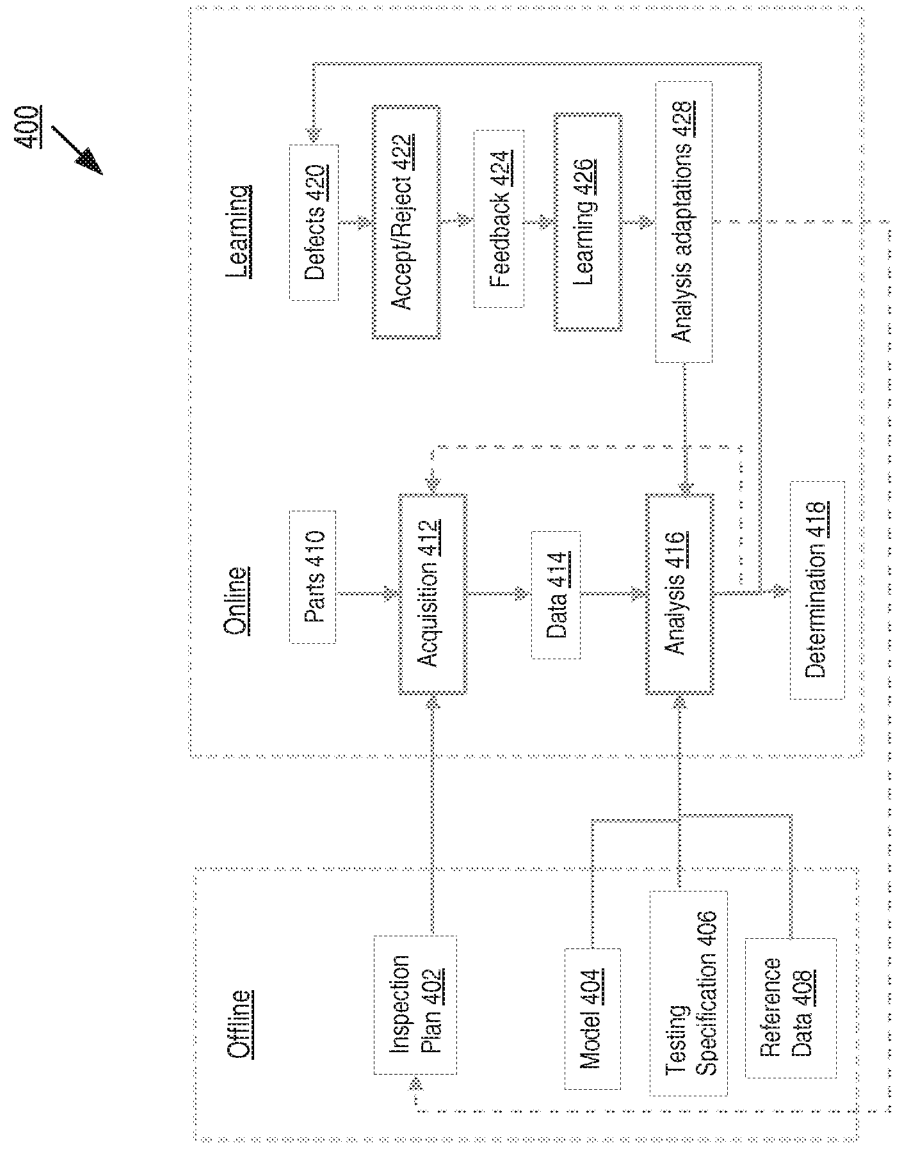
FIG. 4 depicts a flow diagram of aspects of a method for automated inspection in accordance with one implementation of the present disclosure.

In certain implementations, an inspection plan or 'recipe' can be generated at the offline stage (e.g., at 112 of FIG. 1, 214 of FIG. 2, 314 of FIG. 3), and this plan can be used to control the acquisition of data in the 'online' phase (e.g., during subsequent inspections), such as in the manner described herein. The acquired data can then be analyzed in context of the multidimensional model, the reference data and/or the testing specification received from the offline phase, such as in a manner described herein. It should also be understood that while in certain implementations the referenced inspection plan can be generated (e.g., based on various part enrollment and planning processes/operations, such as are described herein) in other implementations such a plan can be received and/or provided (e.g., as depicted at 402 in FIG. 4, showing further aspects of aspects of a method 300 for automated inspection).

In certain implementations, the produced model (which is to be utilized in subsequent inspections) can contain (1) a rough/fine description of the part geometry, and/or (2) a description of various reflectance properties of the part at various points. Using a combination of such descriptions, various predictions/projections can be generated, such as with respect to the response of the part to further/additional measurements taken by the inspection system. In certain implementations, such projections may be generated by building a partial BRDF (Bidirectional reflectance distribution function), such as by capturing multiplicity of angle combinations between the surface normal, lights, and camera.

In certain implementations, additional reference parts can also be provided to the inspection system, such as in order to enhance the accuracy of the generated model (e.g., in order to account for variabilities between parts) and also to generate inspection tolerances for different regions/parts/materials. One such example variability is the inherent variability in texture exhibited by some materials used in production due to their natural structure or due to processes they have undergone such as polishing.

Various testing requirements can then be received and/or generated (e.g., at 108 in FIG. 1, 208 in FIGS. 2, and 310 in FIG. 2). In certain implementations, such requirements can specify/define the parameters based upon/in relation to which the referenced model (e.g., the model generated at 106 in FIG. 1, 206 in FIG. 2, 306 in FIG. 3, and/or received at 404 in FIG. 4) is to be applied (e.g., in relation to the entire part and/or sub-parts thereof), and, in certain implementations, such parameters can be stored/reflected in a testing specification (e.g., at 210 in FIG. 2, 312 in FIGS. 3, and 406 in FIG. 4). One or more inspection plans can then be generated (e.g., based on the model and the testing requirements) (e.g., at 110 and 112 in FIGS. 1, 212 and 214 in FIGS. 2, and 308 and 314 in FIG. 3), as described herein.

It should be understood that the referenced testing requirements may vary in nature and magnitude between parts and even sub-parts. For example, the top region of a particular product (e.g., a polished glass surface) may be required to be of very high quality and without even a tiny scratch whereas another region of the product (e.g., its bottom) may be acceptable even with moderate scratches. Accordingly, in certain implementations an interface can be provided (e.g., a graphical user interface), through which inputs can be received that may define/associate certain sub parts or regions of the model with names/labels (e.g. "handle", "cover", etc.), and/or to assign different requirements to each such sub-part. Examples of such requirements include but are not limited to identifying scratches of a certain size/significance, identifying the presence of physical connectors (e.g., an RJ45 connector or any other such modular connector), etc. In certain implementations, the referenced interface for defining the testing requirements can utilize, incorporate, and/or reference a CAD model of the product (e.g., as received and/or processed at 202 of FIGS. 2 and 302 of FIG. 3) and/or the multidimensional model (e.g., as generated at 106 in FIG. 1, 206 in FIGS. 2, and 306 in FIG. 3). The referenced interface can enable a user (e.g. an administrator) to define and/or modify the testing requirements for specific sub parts, regions, etc., of the part/object to be inspected. Additionally, in certain implementations the referenced interface can present the user with initially generated requirements, e.g., as generated based on variabilities identified in the initial inspection/enrollment of multiple reference or flawless/'golden' parts.

Examples of tested modalities include but are not limited to: material integrity (e.g. scratches, bumps, dents, cracks, blisters, etc.), discoloring, object existence, assembly alignment, text/labels, screws, connects, etc. It should also be understood that each tested modality can be associated with any number of sensitivity levels (whether absolute or relative), e.g., minor, moderate, major, custom, etc.

The referenced acquisition/inspection plans can define the configurations, settings and/or positions with respect to which the referenced requirements can be tested based on the model. Examples of such settings include, but are not limited to, position, orientation and activation of the optical head, as well as the sequence in which they are to be utilized.

In certain implementations the acquisition/inspection plans can be configured to cover the entire part to be inspected (or the area of the product which is to be inspected) in a manner that enables the verification of all testing requirements considering the surface properties. In certain implementations, the referenced verification process can be performed in conjunction with a knowledge base (e.g., a 'best practices' knowledge base), such as is described herein, e.g., with respect to FIG. 5. For example, it can be appreciated that capturing an image of specular surface at a straight angle using direct illumination is likely to result in a saturated image, which is not advantageous for purposes of the described inspection. Moreover, in certain implementations the referenced inspection plans can be configured to account for the kinematics and/or dynamics of the inspection system and/or other moving mechanisms. For example, in the case of fixed cameras or illumination devices, the configuration and its limitations can be used in the planning. Additionally, the inspection plans can be generated in a manner that accounts for different inspection modalities. For example, when inspecting connectors, inspection plans can be generated which ensure that images are captured at the proper angles (e.g., to ensure that the inside of the connector is visible in the proper way). Such plans can also be generated such that they enable the part to be scanned efficiently (e.g., to enable high system throughput).

It should be understood that the generated model can enable the prediction of the quality associated with various configurations/positionings (e.g., of the optical head), based upon which various inspection plans can be generated (e.g., in order to optimize the speed/efficiency of the scanning process). It should also be noted that structurally similar parts with comparable testing requirements may still yield different inspection plans, such as if their surfaces have different properties (e.g. if one is specular while the other is of diffusive nature).

The referenced configurations/positionings (e.g., of the optical head) can be ordered into a sequence so as to enable the inspection system to pass through them and complete the scanning of the product in a quick/efficient manner. In certain implementations, aspects, features, limitations, etc.

of the underlying hardware platform (e.g., of the inspection system) can be accounted for. For example, if the optical head is mounted on a robot, a robot figure can be selected for a particular position (it should be noted that there may be several joint configurations that may attain the same spatial position of the robot tool, and such joint configurations can be divided into "figures" so that for each figure there is only a single option to reach a desired position). The time difference resulting from the joint difference (e.g., of the robot arm on which the optical head is mounted) between two configurations/positions can be accounted for in order to determine the fastest tour of the object. Interpolation can also be performed between the selected configurations so that the transitions will be efficient and the robot will not collide into its surrounding nor into the inspected part.

The system can then sample (e.g., capture or otherwise acquire or receive images of and/or other sensor inputs pertaining to) the part at the referenced positions (e.g., at 114 in FIGS. 1 and 216 in FIG. 2), thereby generating reference data (e.g., at 116 in FIG. 1, 218 in FIGS. 2, and 408 in FIG. 4). Moreover, in certain implementations such data can be generated via interpolation and/or extrapolation (such as with respect to measured positions). One or more determinations can also be made as to the manner in which to traverse the referenced positions (e.g., most efficiently).

In certain implementations, the referenced inspection plan can also be generated based on various inspection priorities. For example, in a scenario in which a particular area or region of a part is more susceptible to defect (as can be determined, for example, based on the structure of such a region, the materials associated with such a region, cosmetic requirements, and/or the manufacturing process associated with such a region) or is associated with more stringent inspection requirements, the scanning of such a region can be prioritized. In such a scenario, upon determining that a defect is present in the specified region of a particular part, such a part can be identified as being defective and the system can terminate the inspection process (e.g., without inspecting the remainder of the part) and proceed in inspecting another part. Additionally, in certain implementations a model of the part being inspected (whether a CAD model or a generated model) can be provided to an administrator and various inputs can be received from such an administrator (e.g., via a graphical user interface), indicating/designating different areas of the model with different detection criteria (e.g., the administrator may designate one area of the part as requiring a relatively higher degree of quality, smoothness, etc., while designating another area as requiring relatively a relatively lesser degree of quality). Moreover, the administrator can also be presented with projected defects of the specific part (e.g., as based on the last one or from a saved history) as well as statistics about the part (e.g., based on the inspection history). Additionally, in certain implementations a balance/compromise between inspection speed and inspection level (e.g., the degree of breadth/detail of the inspection) can be controlled/adjusted (e.g., based on parameters associated with the part being inspected, the manufacturing process, and/or parameters provided by an administrator).

Additionally, in certain implementations data and/or various aspects of the manufacturing process can be utilized in generating an inspection plan and employing/implementing such a plan in inspecting a part. For example, in a scenario in which certain irregularities are identified with respect to the manufacturing of a particular part (e.g., the temperature of the manufacturing machine was higher/lower than usual when the part and/or a region thereof was manufactured), such data can be accounted for in determining an inspection plan (and/or modifying an existing inspection plan). By way of illustration, a region of the part with respect to which such a manufacturing irregularity is determined to have occurred can be inspected first (on account of the increased likelihood that a defect is present in such a region) before proceeding to other regions of the part.

Moreover, in certain implementations, various aspects of an inspection plan generated with respect to one part can be utilized in generating an inspection plan with respect to a similar/related part. For example, in a scenario in which an inspection plan has already been developed for one part having a particular structure that is made up of a first material, such an inspection plan can be utilized in determining an inspection plan for another part having the same or comparable structure but being made up of another material. By way of illustration, the geometric parameters of both such products are likely to be the same, and thus only the reflectance properties, for example, may need to be updated.

In certain implementations, once the inspection plan is finalized, the selected optical head configuration can be sampled. For each such configuration the various measurements (e.g. 2D images, 3D measurements) can be stored for reference analysis. Sensitivity analysis may also be performed, such as by repeating the sample, to account for noise, sampling at a close 3D position, (e.g., to account for robot inaccuracies), and/or using several golden/reference parts (e.g., to account for parts inherent variations).

Figure 8:
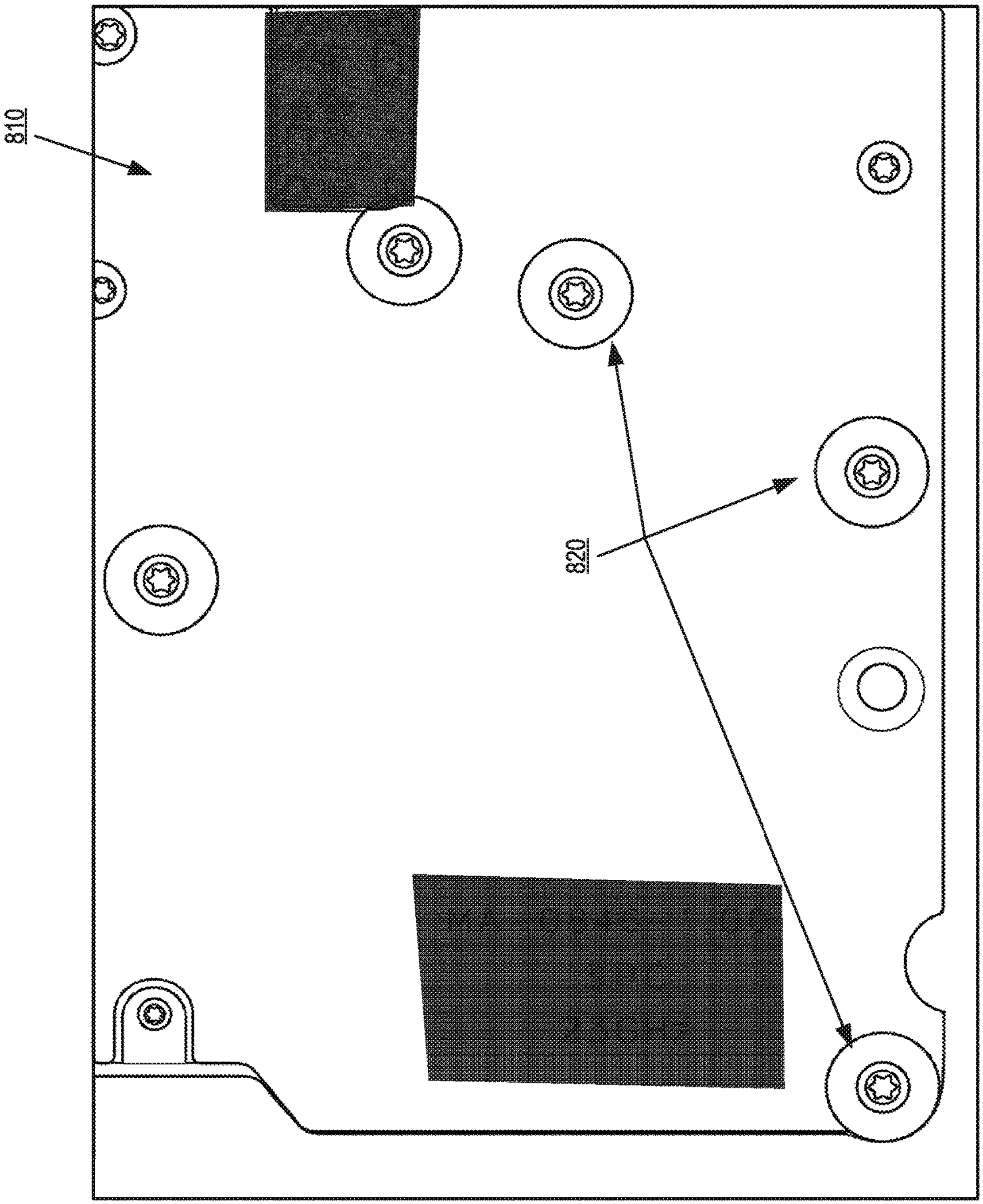
FIG. 8 depicts one or more aspects of an exemplary inspection process in accordance with one implementation of the present disclosure

By way of further illustration, FIG. 8 depicts a reference part 810 that can be inspected/analyzed (e.g. using an inspection system such as inspection system 700 as depicted in FIG. 7A-7B and described in detail herein). As described herein, in certain implementations the reference part can be scanned, analyzed, processed, etc., and an inspection plan can be generated based upon which subsequent parts (e.g., parts that are comparable, similar, etc., to the reference part) can be inspected (e.g., using the same inspection system 700 and/or another inspection system, device, etc.). It should also be noted that, in certain implementations, in lieu of performing an actual inspection of the reference part 810, the inspection plan can be generated and/or provided (e.g., as dictated or defined by the product manufacturer).

As also depicted in FIG. 8, various areas, regions, etc. 820 within the reference part 810 can be identified. Such areas or regions 820 can correspond to points or aspects of interest within the reference part with respect to which additional and/or different types of analysis are to be applied. For example, FIG. 8 depicts various areas or regions 820 that correspond to presence of and/or placement/arrangement of screws within the part 810. It should be understood that in certain implementations such areas/regions can be identified in an automated fashion (e.g., based on an analysis of one or more images of the reference part) while in other implementations such areas/regions can be identified/selected manually (e.g., by an administrator, user, etc., who can select those areas/regions and define how they are to be analyzed, e.g., to determine the presence of a screw, its orientation, etc.).

At this juncture it should be noted that while in certain implementations (such as the exemplary scenario described with respect to FIG. 8) areas/regions of the reference part can be identified/selected in order to associate such areas/regions with additional processing/analysis parameters (e.g., to determine the presence of a screw, its orientation, etc.), in other implementations areas/regions can be identified/selected and associated with relatively fewer processing/analysis parameters. For example, in certain implementations one or more areas/regions of a reference part can be identified (whether in an automated fashion or manually) as requiring less and/or no inspection. Accordingly, in subsequent inspections, corresponding areas/regions (e.g., in a part that is undergoing inspection) can be subject to fewer and/or no inspection analysis. In doing so, the described technologies can improve and/or optimize the efficiency of the inspection of such parts, by inspecting only those regions that require inspection in accordance with the inspection parameters that such regions require while not devoting time and/or processing resources to the inspection of other areas/regions that do not require inspection (or do not require inspection in accordance with certain inspection parameters).

Figure 10C:
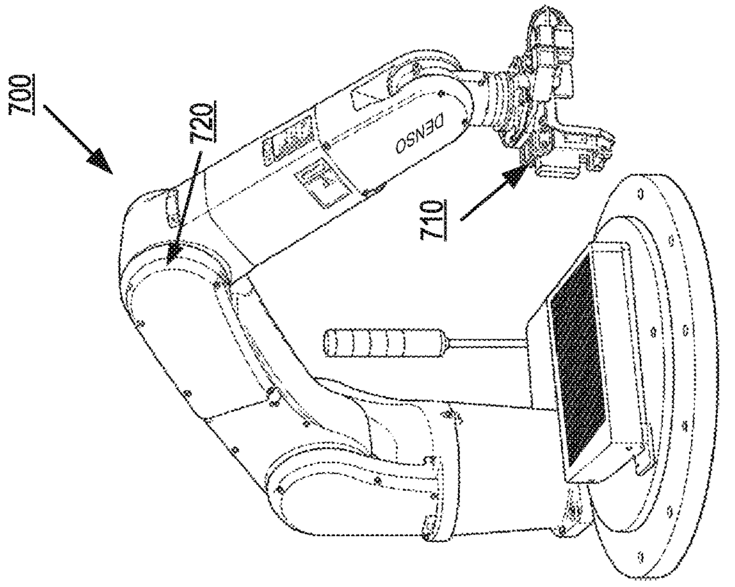
FIGS. 10A-10C depict one or more aspects of an exemplary inspection system in accordance with various implementations of the present disclosure.
Figure 10B:
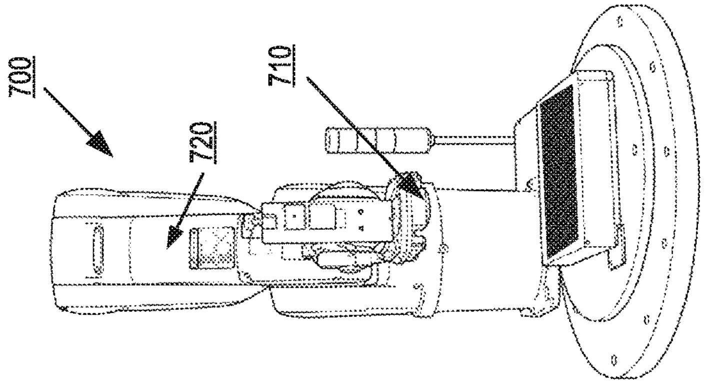
Figure 10A:
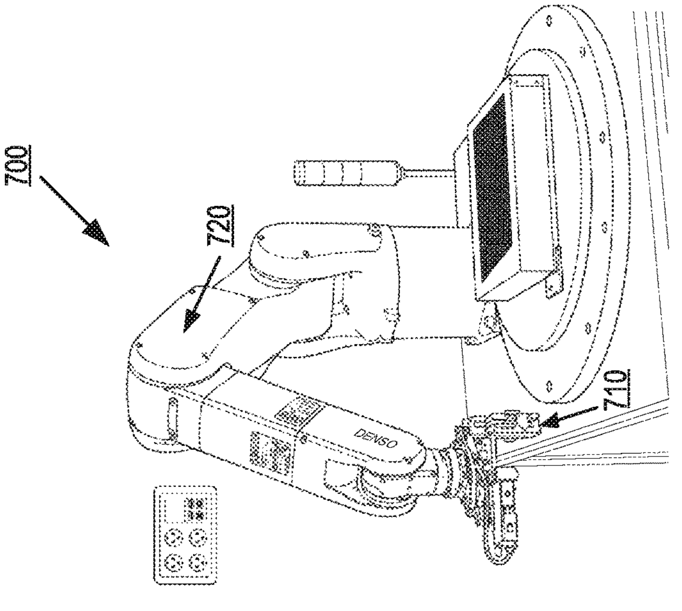

In the referenced 'online' process, the system can carry out, apply, or otherwise perform the referenced inspection plan by acquiring the required sensory data of a part to be inspected (e.g., at 118 in FIGS. 1 and 410 in FIG. 4) (e.g., by capturing or otherwise acquiring images and/or other sensor data (e.g., at 120 in FIGS. 1 and 412 in FIG. 4), such as in a particular sequence, as dictated by the generated inspection plan). By way of illustration, FIGS. 10A-10C depict an exemplary sequence in which moveable arm/robot 720 of inspection system 700 adjusts the positioning of optical head 710 in order to execute an inspection plan (e.g., an inspection plan computed to enable the system 700 to perform the referenced inspection as efficiently and/or effectively as possible, such as is described herein). It should be understood that, in certain implementations, the inspection plan may be modified or adjusted during the inspection, for example, by taking additional images, such as closer/more focused images/additional angles (e.g., in case of uncertainty).

In certain implementations, if the positioning of the part(s) to be inspected is determined not to be accurate enough, various measurements/images can be initially captured, e.g., from a relatively far position (e.g., to enable coverage of the entire object). Such images can then be compared to the referenced model in order to compute the actual position of the part. The inspection plan can then be adapted to this actual position (for example, not only correcting the planned positions, but also recomputing the transformations to the underlying hardware parameters).

The acquired data (e.g., at 122 of FIGS. 1 and 414 of FIG. 4) on the part being inspected and the reference part(s) and/or the CAD model can then be analyzed and/or otherwise processed (e.g., at 124 of FIGS. 1 and 416 of FIG. 4) and a determination can be made (e.g., at 126 of FIGS. 1 and 418 of FIG. 4) with respect to the part being inspected, reflecting, for example, whether the part is valid/approved or defective (e.g., in light of an analysis of the acquired images and other sensory data in view of/with respect to the defined testing requirements). Such a determination can be based on various absolute and relative measurements, such as may be defined with respect to the particular part (e.g., the size of a scratch or imperfection on a particular surface). Moreover, in certain implementations, a determination can be made with respect to a grading or scoring of the part (reflecting, for example, the degree to which it does or does not correspond to the reference part, the significance of a particular deviation from the reference part, etc.). It should also be noted that in certain cases additional images and/or data may be acquired (e.g., at 120 of FIGS. 1 and 412 of FIG. 4) during the referenced analysis (e.g., in order to further determine one or more aspects which may not be perceptible in the initial images) and such images/data can be analyzed and/or otherwise processed in order to compute/determine an outcome, score, grading, etc., for the part.

For example, for each testing requirement the collected sensory data can be processed in order to verify whether the object being inspected does/does not comply (and/or the degree thereof). In certain implementations, the following exemplary process can be utilized:

- For one or more of the data items (e.g. images) captured/acquired during inspection of a part and/or with respect to one or more testing requirements defined for the inspection of such a part:
  - One or more relevant parts, regions, areas, etc. of the data items that pertain to a particular test can be identified, defined, and/or determined (e.g. an image and/or relevant sections thereof can be processed to determine that it is of a high enough quality, e.g., with respect the resolution of the image, the illumination of the image, etc., in order to comply with the testing requirements associated with the inspection plan)
  - One or more absolute (e.g. homogeneity) and relative criteria (e.g. similarity to reference measurements on golden part images) can be applied to the data items (e.g., images) in order to validate various aspects of the part being inspected, including but not limited to measurements, dimensions, etc. of the part, as described herein.
  - If the measurements of the part under inspection are determined not to be within a tolerance/margin of error/sensitivity (e.g., as defined in conjunction with the testing requirements and/or by an operator), the part can be determined to be defective. Further analysis can classify the defect, determine its severity, etc.
  - In cases where the confidence of a suspicious defect is not high enough, the system can adjust and/or augment the inspection plan, e.g., to perform additional measurements in order to improve the confidence. For example, by capturing closer images.
- Defects that are identified can be mapped to corresponding areas/regions of the object (e.g., using the generated model), thereby enabling further analysis (automated and/or manual), and statistics.

It should be understood that, as noted, various validation operation(s) can be performed with respect to the part being inspected. In certain implementations, such validation operations can include validating various aspects or characteristics of the part with respect to one or more absolute criteria/test(s). For example, a part (e.g., various sensor inputs captured/received with respect to such a part) (and/or an area or region thereof) can be processed, analyzed, etc. in order to determine whether or not (and/or the degree to which) the part contains/reflects certain absolute criteria (e.g., whether the color of the part is red, whether scratches are present on the part, etc.). In other implementations, such validation operations can include validating various aspects or characteristics of the part with respect to one or more relative criteria/test(s). For example, a part (e.g., various sensor inputs captured/received with respect to such a part) (and/or an area or region thereof) can be processed, analyzed, etc. in order to determine whether or not (and/or the degree to which) the part contains/reflects certain relative criteria (e.g., whether the part being inspected does/doesn't correspond to/reflect, etc. determinations made with respect to and/or associated with a reference part, such as in a manner described herein).

In yet other implementations, the referenced validation operation(s) can include validating various aspects or characteristics of the part with respect to one or more criteria/test(s) that may be reflected/embedded in various identifier(s) (e.g., a bar code, QR code, etc.) that may be affixed to or associated with the part under inspection. For example, it can be appreciated that an identifier (e.g., a bar code, QR code, etc.) can be embedded with or otherwise associated with or reflect metadata that can pertain to various aspects of a part (e.g., a serial number of such a part, a color of such a part, etc.) that such an identifier is directed to. Accordingly, the metadata associated with such an identifier (e.g., the serial number that the identifier pertains to, the color that the identifier reflects, etc.) can be compared with one or more determinations computed during an inspection of the part (e.g., the alphanumeric serial number actually reflected on the part itself, the actual color of the part itself, as determined based on a processing of the various sensor inputs captured/received with respect to such a part, as described herein) (and/or an area or region thereof) in order to determine whether or not (and/or the degree to which) the part under inspection reflects the criteria reflected in the metadata of the associated identifier (e.g., whether the serial number depicted on the part corresponds to the serial number reflected in the barcode that is affixed to the part, whether the color of the part corresponds to the color reflected in the barcode that is affixed to the part, etc.). In doing so, the described technologies can ensure that the referenced parts are internally consistent (e.g., in that the part itself properly reflects the criteria embedded in an identifier associated with/affixed to the part).

In yet other implementations, the referenced validation operation(s) can include validating various aspects or characteristics of the part with respect to one or more criteria/test(s) that may be received/provided in conjunction with the part(s) under inspection. For example, in conjunction with the inspection of a particular part, various data items can be provided by and/or received from a manufacturing station, factory, etc., (e.g., a server associated with the factory in, etc.) which can reflect or correspond to various criteria or characteristics that the part is expected or required to meet/have. Accordingly, the received criteria, characteristics, etc., can be compared with one or more determinations computed during an inspection of the part (e.g., the color of the part itself, as determined based on a processing of the various sensor inputs captured/received with respect to such a part, as described herein) (and/or an area or region thereof) in order to determine whether or not (and/or the degree to which) the part under inspection reflects the received criteria, characteristics, etc.). In doing so, the described technologies can ensure that the inspected part(s) are consistent with the criteria, characteristics, etc. as dictated by the part manufacturer, etc.

Figure 9B:
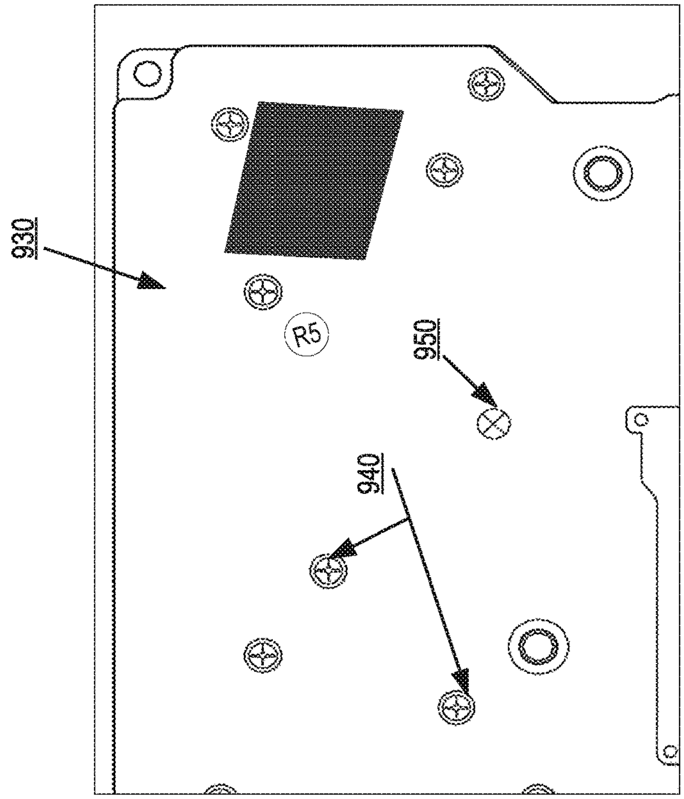
FIGS. 9A-9B depict one or more aspects of an exemplary inspection process in accordance with various implementations of the present disclosure.
Figure 9A:
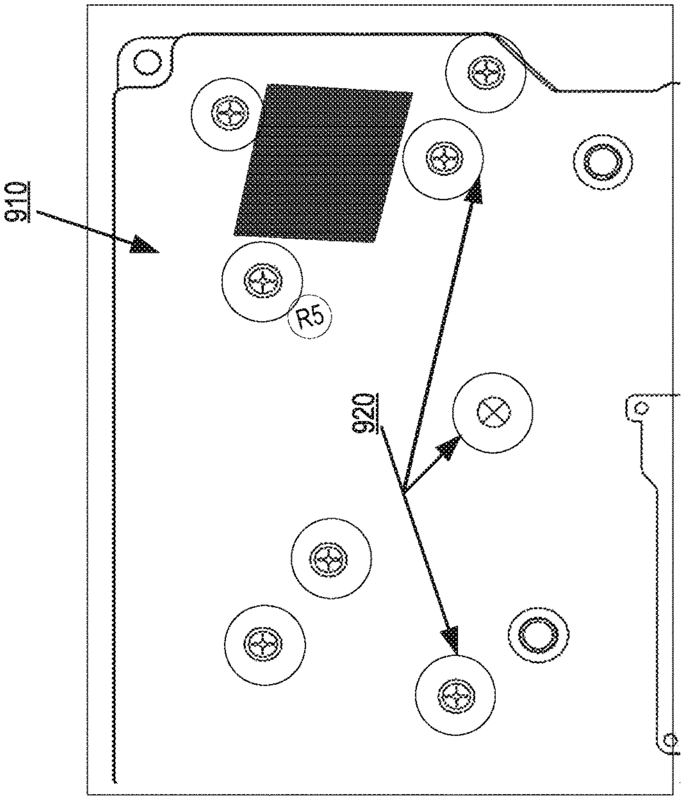

By way of further illustration, FIGS. 9A and 9B depict an exemplary inspection scenario. FIG. 9A depicts an inspection of a reference part 910, showing various areas, regions, etc. 920 within the reference part 910 that correspond to points or aspects of interest within the reference part with respect to which additional and/or different types of analysis are to be applied (e.g., presence of and/or placement/arrangement of screws within the part 910). Having identified such areas/regions and computed an inspection plan, a subsequent part (e.g., part 930 as shown in FIG. 9B) can be inspected (e.g., based on the referenced inspection plan). Accordingly, as shown in FIG. 9B, areas/regions of part 930 that correspond to those areas/regions 920 can be processed/analyzed (e.g., using specific parameters included in the inspection plan) to identify the presence and/or position of the referenced screws within part 930. In doing so, the described technologies can identify areas (940) within the part 930 that do comply with the inspection requirements/parameters included in the inspection plan, as well as areas (950) within the part 930 that do not comply with the inspection requirements/parameters included in the inspection plan (e.g., areas in which a screw is missing, not fully tightened, etc.)

It should also be understood that the referenced inspection system can be configured to inspect different parts with little or no modification/adjustment. For example, in certain implementations the identity of a part can be initially determined, such as by reading a barcode that identifies the part and/or based on a recognition process based on a 2D or 3D image of the part. Having identified the specific part, a corresponding inspection scheme/plan can be generated and/or selected and the part can be inspected based on the appropriate inspection scheme/plan (such as in a manner described herein). In doing so, a single inspection system/station can be used to inspect different parts with little or no delay or 'downtime' between inspections of different parts.

By way of further illustration, in certain implementations one or more identifiers (e.g., a serial number, bar code, QR code, etc., that may be present on a part to be inspected) can be used in identifying, selecting, and/or adjusting an inspection plan to be utilized in inspecting the referenced part. That is, it can be appreciated that while, in certain implementations the described technologies may be capable of determining (e.g., in advance) which inspection plan is to be employed with respect to a particular product to be inspected (e.g., in a scenario in which an assembly line or manufacturing facility or station is producing a particular part), in other implementations the described technologies (e.g., the inspection system) may not necessarily determine in advance the exact nature or identity of the part that it is presently inspecting. Accordingly, in certain implementations the described technologies (e.g., the robotic arm and/or optical head of an inspection system, such as is described herein) can capture or otherwise receive one or more inputs via one or more sensors (e.g., an optical sensor or any other such sensor) and process such inputs in order to identify or otherwise recognize or determine the presence of one or more identifiers (e.g., a serial number or model number of the part, a bar code, QR code, etc.).

By way of illustration, in certain implementations, upon identifying the presence of one or more alphanumeric characters (e.g., within image(s) of the part as captured by the inspection system), such characters can be processed (e.g., using various optical character recognition (OCR) techniques) in order to identify the characters, string, serial number, etc., present on the part. Having identified such character(s) on the part, the described technologies can further query one or more databases or repositories which may contain previously computed or provided inspection plan(s) for the referenced part (e.g., as may have been computed using one or more of the techniques described herein). Those inspection plan(s) associated with/related to the part can then be provided to/received by the inspection system and the inspection of the part can be performed based on such plan(s). In doing so, an inspection system can efficiently identify a part to be inspected and request/receive inspection plans associated with such a part without necessitating additional 'exploration' by the inspection system in order to identify the part to be inspected.

By way of further illustration, in certain implementations, the referenced identifier(s) (e.g., a bar code, QR code, etc., which, as noted, can be affixed to the part to be inspected) can be encoded with information pertaining to various aspects/characteristics of the associated part (e.g., material type, dimensions, etc.) and/or instructions that can correspond to inspection plan(s) for the associated part (e.g., as may have been computed using one or more of the techniques described herein). Accordingly, upon recognizing, identifying, etc., the presence of such an identifier on the part, the identifier can be processed (e.g., by an inspection system as described herein) in order to computed/determine the associated/embedded inspection plan(s) that pertain to the part and the and the inspection of the part can be performed based on such plan(s). In doing so, an inspection system can efficiently identify inspection plans associated with a part to be inspected without necessitating additional 'exploration' by the inspection system and/or communications to/from external database(s)/repositories.

In certain implementations, a 'learning' process can also be implemented. Such a process may be employed subsequent and/or in parallel to the described 'online' process. In such a learning process, various identified defects (e.g., as identified during the automated inspection process) generated by the described inspection system can be provided/presented to a user (e.g., an inspection supervisor) (e.g., at 128 of FIGS. 1 and 420 of FIG. 4), and such a user can manually accept or reject the referenced determinations (e.g., at 130 of FIGS. 1 and 422 of FIG. 4). Based on such feedback (e.g., at 132 of FIGS. 1 and 424 of FIG. 4) the system can 'learn' (e.g., at 134 of FIGS. 1 and 426 of FIG. 4) (e.g., using machine learning techniques as are known to those of ordinary skill in the art) from the feedback and further improve the detection/determination process. Furthermore, the learning process can also be used to adapt or alter the inspection plan (e.g., at 136 of FIGS. 1 and 428 of FIG. 4). For example, areas which are determined or otherwise identified to be more prone to errors can be inspected at a higher quality.

It should be understood that the referenced operations can enable adaptation of the detection results with respect to the quality assurance. It should also be understood that, in certain implementations, such operations may be performed in parallel to the described 'online' process.

In certain implementations, inputs/feedback can be received with respect to the detection results generated by the system (e.g., indicating whether such results are accepted or rejected). In certain implementations, a user providing such feedback may have access to the sensory data upon which the detection result was made and/or the actual tested part. Such indications of acceptance/rejection can be collected and utilized in a machine learning process. In doing so, the system can be further adapted/configured to the requirements, standards, and/or preferences of a particular manufacturer. A successful learning process is enabled as a result of the fact that the planning process produces standardized measurements for each testing requirement which can then be processed in a uniform manner.

Additionally, during the described online inspection process, the system can receive/compile data and/or generate statistics regarding defects that are identified on the parts under inspection. Such data can, for example, reflect and/or be used to determine the classes and/or locations of such defects, as well as related statistics. Such information can be provided back to various product design/prototyping engine/systems (e.g., CAD/CAM software, systems, etc.) where it can be utilized in modifying/correcting the design of the model. Additionally, the actual defect information can be provided to other stations in the manufacturing process (e.g., to fixing machines that can correct the defects, such as based on their location and type). Moreover, in certain implementations various determinations, predictions, and/or instructions can be made with respect to the manner in which such corrections are to be made (e.g., the most efficient way to correct a manufacturing defect in order to minimize the 'downtime' of the manufacturing process).

In certain implementations, the data collected and/or generated at the various stages/operations of the described techniques/technologies (e.g., with respect to various parts, structures, materials, models, etc.) can be aggregated/stored (e.g., in a database). Various techniques (e.g., machine learning, etc.) can be applied to such data, such as in order to determine/predict how/where defects may arise in future products and various suggestions can be generated with respect to how such defects may be avoided or minimized. For example, having identified many imperfections in parts of a certain shape that are made from a certain material, an alternative shape (with respect to which fewer imperfections were observed) and/or an alternative material (with respect to which fewer imperfections were observed) can be suggested. In doing so, defects can be avoided prior to the manufacturing process beginning.

In certain implementations, the described techniques/technologies can be employed with respect to 3D printing technologies/techniques, including but not limited to fused deposition modeling (FDM). For example, throughout the 3D printing process the part/object being printed can be inspected (e.g., in the manner described herein) in order to identify defects. Upon identifying such defects, the printing process can be paused/aborted (thereby reducing the amount of material wasted on the defective part) or the printing process can be adjusted to account for and correct the defect (where possible—e.g., in a scenario where there is a hole in the object that can be filled in). Moreover, in certain implementations the original 3D printing plan/process can be adjusted to account for the periodic/ongoing inspection of the part being printed. For example, various segments/regions of the part (e.g., regions that may be more susceptible to defects) may be prioritized (e.g., printed earlier in the printing process), and once such regions are determined to have been printed without defects, the remainder of the part can be printed.

It should also be noted that while the described techniques and technologies are described herein primarily with respect to product inspection (e.g., using inspection systems such as are depicted and described herein), the described techniques/technologies are not so limited. Accordingly, it should be understood that the described techniques/technologies can be similarly implemented and/or employed in other settings and contexts. By way of illustration, in certain implementations the described technologies can be employed with respect to larger scale inspections, such as inspections of larger structures such as buildings, bridges, roads, tunnels, etc. In such implementations, a vehicle (equipped with various camera(s), sensors, etc.) can be used to maneuver in relation to (e.g., around and/or within) such a structure. Examples of such vehicles include but are not limited to manned vehicles such as a car, bicycle, etc., unmanned vehicle such as an Unmanned Aerial Vehicle (UAV) or 'drone,' remote-controlled car, boat, etc. or any other such maneuverable device. In such implementations, the referenced vehicles or maneuverable devices can be configured to perform an initial inspection (e.g., on a prototype or ideally constructed structure) and/or model(s) that define the ideal/intended dimensions and characteristics of such a structure can be processed. In doing so, an inspection plan (e.g., for the actual structure, etc., to be inspected) can be computed. As described herein, various considerations can be accounted for in computing such an inspection plan. For example, one or more important or crucial areas of the structure to be inspected can be identified and the path in which the vehicle maneuvers in performing the referenced inspection can account for the prioritization of such areas. By way of further example, certain technical limitations of the vehicle/device can be accounted for (e.g., battery limitations that may affect flight time of a drone, limitations on where the vehicle may or may not travel, altitude/reception limits, etc.) in computing the referenced inspection plan. In doing so, the described technologies can enable the referenced structure to be inspected in a manner that is likely to be most efficient and effective. Having computed the referenced inspection plan, the vehicle can execute the plan, such as in a manner described herein (e.g., with respect to product inspection).

It should also be understood that the components referenced herein can be combined together or separated into further components, according to a particular implementation. Additionally, in some implementations, various components of a particular device may run on separate machines.

It should also be noted that while the technologies described herein are illustrated primarily with respect to product inspection, the described technologies can also be implemented in any number of additional or alternative settings or contexts and towards any number of additional objectives.

Figure 11:
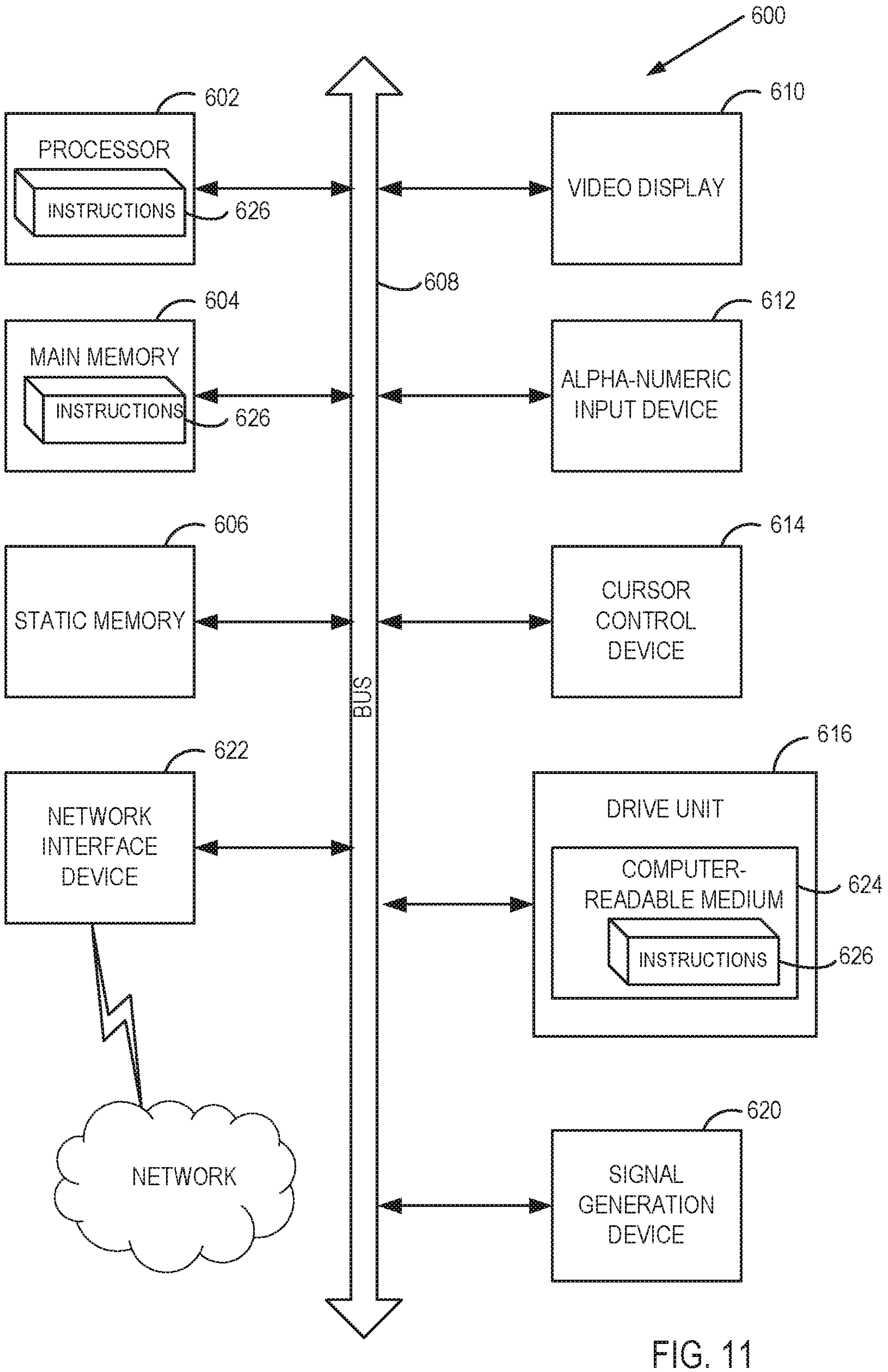
FIG. 11 depicts a block diagram of an illustrative computer system operating in accordance with aspects and implementations of the present disclosure.
Figure 12:
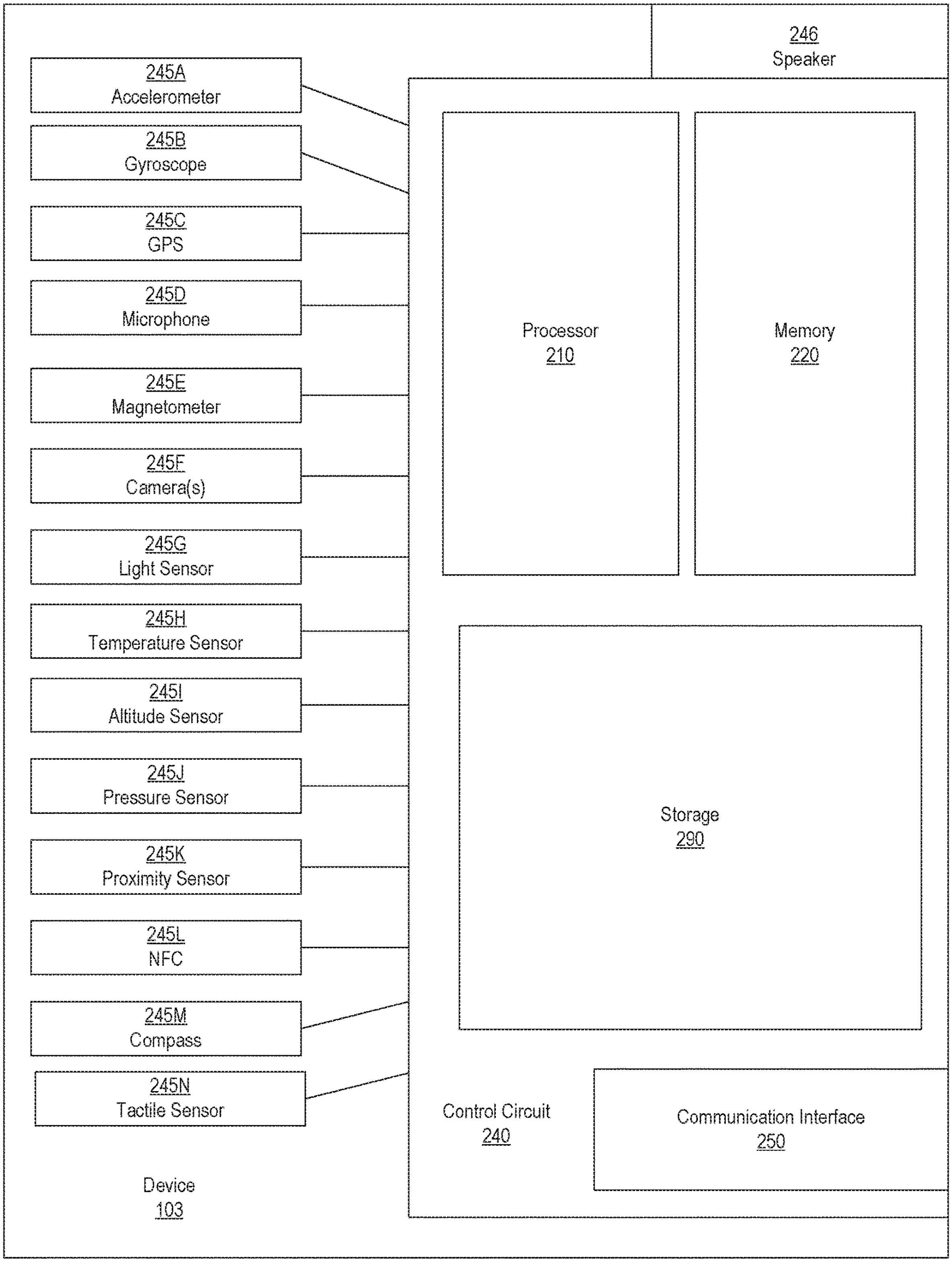
FIG. 12 depicts an exemplary implementation of a device in accordance with aspects and implementations of the present disclosure.

FIG. 11 depicts an illustrative computer system within which a set of instructions, for causing the machine to perform any one or more of the methodologies discussed herein, may be executed. In alternative implementations, the machine may be connected (e.g., networked) to other machines in a LAN, an intranet, an extranet, or the Internet. The machine may operate in the capacity of a server machine in client-server network environment. The machine may be a personal computer (PC), a set-top box (STB), smart camera, a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein. It should also be noted that various further aspects of the referenced computer system in accordance with certain implementations are also depicted in FIG. 12 and described below.

The exemplary computer system 600 includes a processing system (processor) 602, a main memory 604 (e.g., read-only memory (ROM), flash memory, dynamic random access memory (DRAM) such as synchronous DRAM (SDRAM)), a static memory 606 (e.g., flash memory, static random access memory (SRAM)), and a data storage device 616, which communicate with each other via a bus 608.

Processor 602 represents one or more general-purpose processing devices such as a microprocessor, central processing unit, or the like. More particularly, the processor 602 may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processor 602 may also be one or more special-purpose processing devices such as an application specific integrated circuit (ASIC), a field programmable gate array (FPGA), a digital signal processor (DSP), network processor, or the like. The processor 602 is configured to execute instructions 626 for performing the operations and steps discussed herein.

The computer system 600 may further include a network interface device 622. The computer system 600 also may include a video display unit 610 (e.g., a liquid crystal display (LCD) or a cathode ray tube (CRT)), an alphanumeric input device 612 (e.g., a keyboard), a cursor control device 614 (e.g., a mouse), and a signal generation device 620 (e.g., a speaker).

The data storage device 616 may include a computer-readable medium 624 on which is stored one or more sets of instructions 626 embodying any one or more of the methodologies or functions described herein. Instructions 626 may also reside, completely or at least partially, within the main memory 604 and/or within the processor 602 during execution thereof by the computer system 600, the main memory 604 and the processor 602 also constituting computer-readable media. Instructions 626 may further be transmitted or received over a network via the network interface device 622.

While the computer-readable storage medium 624 is shown in an exemplary embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing, encoding or carrying a set of instructions for execution by the machine and that cause the machine to perform any one or more of the methodologies of the present disclosure. The term "computer-readable storage medium" shall accordingly be taken to include, but not be limited to, solid-state memories, optical media, and magnetic media.

FIG. 12 depicts further aspects of a computing device 103 that can be configured to implement one or more of the technologies and/or techniques described herein. Device 103 can be a rackmount server, a router computer, a personal computer, a portable digital assistant, a mobile phone, a laptop computer, a tablet computer, a camera, a video camera, a netbook, a desktop computer, a media center, a smartphone, a watch, a smartwatch, an in-vehicle computer/system, any combination of the above, or any other such computing device capable of implementing the various features described herein. Various applications, such as mobile applications ('apps'), web browsers, etc. (not shown) may run on the user device (e.g., on the operating system of the user device). It should be understood that, in certain implementations, user device 103 can also include and/or incorporate various sensors and/or communications interfaces. Examples of such sensors include but are not limited to: accelerometer, gyroscope, compass, GPS, haptic sensors (e.g., touchscreen, buttons, etc.), microphone, camera, etc. Examples of such communication interfaces include but are not limited to cellular (e.g., 3G, 4G, etc.) interface(s), Bluetooth interface, WiFi interface, USB interface, NFC interface, etc.

As noted, in certain implementations, user device(s) 103 can also include and/or incorporate various sensors and/or communications interfaces. By way of illustration, FIG. 12 depicts one exemplary implementation of user device 103. As shown in FIG. 2, device 103 can include a control circuit 240 (e.g., a motherboard) which is operatively connected to various hardware and/or software components that serve to enable various operations, such as those described herein.

Control circuit 240 can be operatively connected to processor 210 and memory 220. Processor 210 serves to execute instructions for software that can be loaded into memory 220. Processor 210 can be a number of processors, a multi-processor core, or some other type of processor, depending on the particular implementation. Further, processor 210 can be implemented using a number of heterogeneous processor systems in which a main processor is present with secondary processors on a single chip. As another illustrative example, processor 210 can be a symmetric multi-processor system containing multiple processors of the same type.

Memory 220 and/or storage 290 may be accessible by processor 210, thereby enabling processor 210 to receive and execute instructions stored on memory 220 and/or on storage 290. Memory 220 can be, for example, a random access memory (RAM) or any other suitable volatile or non-volatile computer readable storage medium. In addition, memory 220 can be fixed or removable. Storage 290 can take various forms, depending on the particular implementation. For example, storage 290 can contain one or more components or devices. For example, storage 290 can be a hard drive, a flash memory, a rewritable optical disk, a rewritable magnetic tape, or some combination of the above. Storage 290 also can be fixed or removable.

A communication interface 250 is also operatively connected to control circuit 240. Communication interface 250 can be any interface (or multiple interfaces) that enables communication between user device 103 and one or more external devices, machines, services, systems, and/or elements (including but not limited to the inspection system and/or elements thereof as described herein). Communication interface 250 can include (but is not limited to) a modem, a Network Interface Card (NIC), an integrated network interface, a radio frequency transmitter/receiver (e.g., WiFi, Bluetooth, cellular, NFC), a satellite communication transmitter/receiver, an infrared port, a USB connection, or any other such interfaces for connecting device 103 to other computing devices, systems, services, and/or communication networks such as the Internet. Such connections can include a wired connection or a wireless connection (e.g. 802.11) though it should be understood that communication interface 250 can be practically any interface that enables communication to/from the control circuit 240 and/or the various components described herein.

At various points during the operation of described technologies, device 103 can communicate with one or more other devices, systems, services, servers, etc., such as those depicted in the accompanying figures and/or described herein. Such devices, systems, services, servers, etc., can transmit and/or receive data to/from the user device 103, thereby enhancing the operation of the described technologies, such as is described in detail herein. It should be understood that the referenced devices, systems, services, servers, etc., can be in direct communication with user device 103, indirect communication with user device 103, constant/ongoing communication with user device 103, periodic communication with user device 103, and/or can be communicatively coordinated with user device 103, as described herein.

Also preferably connected to and/or in communication with control circuit 240 of user device 103 are one or more sensors 245A-245N (collectively, sensors 245). Sensors 245 can be various components, devices, and/or receivers that can be incorporated/integrated within and/or in communication with user device 103. Sensors 245 can be configured to detect one or more stimuli, phenomena, or any other such inputs, described herein. Examples of such sensors 245 include, but are not limited to, an accelerometer 245A, a gyroscope 245B, a GPS receiver 245C, a microphone 245D, a magnetometer 245E, a camera 245F, a light sensor 245G, a temperature sensor 245H, an altitude sensor 245I, a pressure sensor 245J, a proximity sensor 245K, a near-field communication (NFC) device 245L, a compass 245M, and a tactile sensor 245N. As described herein, device 103 can perceive/receive various inputs from sensors 245 and such inputs can be used to initiate, enable, and/or enhance various operations and/or aspects thereof, such as is described herein.

At this juncture it should be noted that while the foregoing description (e.g., with respect to sensors 245) has been directed to user device 103, various other devices, systems, servers, services, etc. (such as are depicted in the accompanying figures and/or described herein) can similarly incorporate the components, elements, and/or capabilities described with respect to user device 103. For example, the described inspection system and/or elements thereof may also incorporate one or more of the referenced components, elements, and/or capabilities.

In the above description, numerous details are set forth. It will be apparent, however, to one of ordinary skill in the art having the benefit of this disclosure, that embodiments may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "receiving," "determining," "capturing," "processing," or the like, refer to the actions and processes of a computer system, or similar electronic computing device, that manipulates and transforms data represented as physical (e.g., electronic) quantities within the computer system's registers and memories into other data similarly represented as physical quantities within the computer system memories or registers or other such information storage, transmission or display devices.

Aspects and implementations of the disclosure also relate to an apparatus for performing the operations herein. This apparatus may be specially constructed for the required purposes,. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions.

It should be understood that the present disclosure is not described with reference to any particular programming language. It will be appreciated that a variety of programming languages may be used to implement the teachings of the disclosure as described herein.

It is to be understood that the above description is intended to be illustrative, and not restrictive. Many other embodiments will be apparent to those of skill in the art upon reading and understanding the above description. Moreover, the techniques described above could be applied to other types of data instead of, or in addition to those referenced herein. The scope of the disclosure should, therefore, be determined with reference to the appended claims, along with the full scope of equivalents to which such claims are entitled.

It is the intent of the applicant(s) that all publications, patents and patent applications referred to in this specification are to be incorporated in their entirety by reference into the specification, as if each individual publication, patent or patent application was specifically and individually noted when referenced that it is to be incorporated herein by reference. In addition, citation or identification of any reference in this application shall not be construed as an admission that such reference is available as prior art to the present invention. To the extent that section headings are used, they should not be construed as necessarily limiting. In addition, any priority document(s) of this application is/are hereby incorporated herein by reference in its/their entirety.

What is claimed is:

1. A method of automatic inspection of instances of an item of manufacture, the item comprising a plurality of discrete elements of different types, the item including a plurality of discrete elements of a same type, the method comprising:

(a) providing an inspection plan for said instances of said item of manufacture; wherein said inspection plan refers to said discrete elements of different types and assigns a different inspection operation for different types of discrete elements and a same inspection operation to at least two discrete elements of a same type;

(b) detecting a defect with an automated process:

(i) inspecting at least one instance of the item of manufacture using at least one imaging sensor and following said inspection plan;

(ii) automatically identifying a plurality of defects in said at least one instance of the item of manufacture;

(c) automatically modifying said automated process in response to data related to the manufacture of a first discrete element from a plurality of discrete elements of a selected type, and data related to the manufacture of a second discrete element from said plurality of discrete elements of said selected type, the first and second elements being associated with a region in which at least one defect of said plurality of defects is detected; and (d) repeating said (b)-(c) using said modified automated process for at least one of the instances of the item of manufacture;

wherein said detecting comprises applying operations which said inspection plan assigns with reference to each of said referred to elements;

wherein the automatically modifying comprises:

modifying the inspecting of said first discrete element in a first manner in response to detecting said at least one defect, and with respect to inspection operations and/or parameters defined therefor, such that the second discrete element from said plurality of discrete elements of said selected type is to be inspected in a second manner distinct from said first manner;

wherein the modifying the inspecting comprises modifying at least one property of a plurality of properties of a data acquisition portion of the automated process; and wherein the modifying at least one property of the plurality of properties of the data acquisition portion comprises inspecting said item using one or more additional sensors in response to detecting said at least one defect.

2. A method according to claim 1, comprising automatically selecting which images to use for said inspecting.

3. A method according to claim 1, wherein said inspecting comprises inspecting using a plurality of inspection modules, each pertaining to a different certain component and/or context.

4. A method according to claim 1, wherein said at least one imaging sensor is a camera, and wherein said inspection plan includes a trajectory of movement of said item relative to said camera, said modifying comprising modifying said trajectory.

5. A method according to claim 1, wherein said automatically modifying comprises modifying one or more settings of said automatically identifying.

6. A method according to claim 1, wherein said automatically modifying comprises modifying a quality of inspection at one or more parts of said item.

7. A method according to claim 1, wherein said automatically identifying comprises automatically identifying one or more of surface defects, label defects, screws and connectors to verify a presence and condition of an element from said plurality of elements.

8. A method according to claim 1, wherein said inspection plan includes a sequence of inspection instructions, each inspection instruction specifying:

one or more of position, orientation and activation of an optical head, and an illumination setting.

9. A method according to claim 1, wherein said inspection plan refers to a reference object.

10. A method according to claim 1, wherein said inspection plan refers to a best practices database.

11. A method according to claim 1, wherein said automatically modifying comprises automatically modifying using machine learning.

12. A method according to claim 1, wherein said automatically modifying comprises automatically modifying in response to human input.

13. A method according to claim 1, wherein said inspecting comprises inspecting using at least one fixed imaging sensor.

14. A method according to claim 1, wherein said inspecting comprises inspecting using at least one imaging sensor mounted on a robotic arm and configured to move relative to said item of manufacture to provide said inspection.

15. A method according to claim 1, wherein said inspecting comprises inspecting using a maneuverable device to provide relative movement between said at least one imaging sensoreamera and said item of manufacture.

16. A method according to claim 14, comprising automatically generating a trajectory and imaging sensor settings for said robotic arm and said imaging sensor.

17. A method according to claim 1, wherein said automatically modifying comprises predicting quality of inspection based on settings of said inspecting.

18. A method according to claim 1, wherein said inspecting comprises measuring a part of said item of manufacture.

19. A method according to claim 1, comprising generating said inspection plan based on one or both of an enrollment process and a CAD model.

20. A method according to claim 19, wherein said generating comprises automatically generating at least one inspection requirement based on said CAD model.

21. A method according to claim 1, wherein said automatically modifying comprises modifying in response to a marking on said item or a part thereof.

22. A method according to claim 1, wherein said automatically modifying comprises modifying one or both of a number and quality of images acquired according to said inspection plan of a part of said item.

23. A method according to claim 1, wherein said automatically modifying comprises modifying in response to identifying a part of said item or a property of a part of said item.

24. A method according to claim 1, wherein said applying comprises applying operations which said inspection plan assigns according to a quality requirement of a type of discrete element.

25. A method according to claim 1, wherein said applying comprises applying operations which inspection plan assigns according to a location of a discrete element of said plurality of discrete elements relative to a subpart of said item of manufacture.

26. A method according to claim 1, wherein said one or more additional sensors comprise at least one three-dimensional (3D) sensor.

27. A method according to claim 1, wherein said one or more additional sensors comprise at least one tactile sensor.

28. A method according to claim 1, wherein said inspecting using one or more additional sensors comprises one or more of the following:

activating said one or more additional sensors independently of said at least one imaging sensor; and activating said one or more additional sensors to operate jointly with said at least one imaging sensor to acquire inspection data.

29. A method according to claim 1, wherein the modifying at least one property of a plurality of properties of a data acquisition portion comprises modifying at least one image acquisition parameter of said at least one imaging sensor.

30. A method according to claim 29, wherein the at least one image acquisition parameter of said at least one imaging sensor comprises one or more of:

an illumination setting including illumination level and/or direction;

an imaging angle or orientation;

exposure time settings;

a magnification setting; and a number and/or selection of images acquired.

31. A method according to claim 1, wherein the modifying at least one property of a plurality of properties of a data acquisition portion comprises prioritizing inspection of the region and/or the first discrete element.

* * * * *